US009029066B2

(12) United States Patent
Loccufier et al.

(10) Patent No.: US 9,029,066 B2
(45) Date of Patent: May 12, 2015

(54) LITHOGRAPHIC PRINTING PLATE PRECURSOR

(75) Inventors: Johan Loccufier, Zwijnaarde (BE); Philippe Moriame, Antwerp (BE)

(73) Assignee: Agfa Graphics NV, Mortsel (BE)

( * ) Notice: Subject to any disclaimer, the term of this patent is extended or adjusted under 35 U.S.C. 154(b) by 0 days.

(21) Appl. No.: 13/982,605

(22) PCT Filed: Feb. 7, 2012
(Under 37 CFR 1.47)

(86) PCT No.: PCT/EP2012/052026
§ 371 (c)(1),
(2), (4) Date: Jul. 30, 2013

(87) PCT Pub. No.: WO2012/110359
PCT Pub. Date: Aug. 23, 2012

(65) Prior Publication Data
US 2013/0312628 A1 Nov. 28, 2013

Related U.S. Application Data

(60) Provisional application No. 61/446,048, filed on Feb. 24, 2011.

(30) Foreign Application Priority Data

Feb. 18, 2011 (EP) ..................... 11155071

(51) Int. Cl.
*G03F 7/00* (2006.01)
*G03F 7/26* (2006.01)
*B41F 33/00* (2006.01)
*G03F 7/039* (2006.01)
*B41C 1/10* (2006.01)
*C08F 20/38* (2006.01)

(52) U.S. Cl.
CPC ............ *G03F 7/0395* (2013.01); *B41C 1/1008* (2013.01); *B41C 1/1016* (2013.01); *B41C 2201/02* (2013.01); *B41C 2201/14* (2013.01); *B41C 2210/02* (2013.01); *B41C 2210/06* (2013.01); *B41C 2210/20* (2013.01); *B41C 2210/22* (2013.01); *B41C 2210/24* (2013.01); *C08F 20/38* (2013.01)

(58) Field of Classification Search
CPC ............................ B41C 1/1008; B41C 1/1016
USPC .......... 430/270.1, 302; 101/450.1, 453, 463.1, 101/483
See application file for complete search history.

(56) References Cited

U.S. PATENT DOCUMENTS

| 4,045,232 A | 8/1977 | Parkinson |
| 4,458,005 A | 7/1984 | Mohr et al. |
| 4,981,517 A | 1/1991 | DeSanto, Jr. et al. |
| 5,163,368 A | 11/1992 | Pensavecchia et al. |
| 5,174,205 A | 12/1992 | Kline et al. |
| 5,641,608 A | 6/1997 | Grunwald et al. |
| 6,140,392 A | 10/2000 | Kingman et al. |
| 2002/0160299 A1 | 10/2002 | Asawa et al. |
| 2004/0018443 A1* | 1/2004 | Aoshima ............... 430/270.1 |
| 2004/0023155 A1 | 2/2004 | Hayakawa et al. |
| 2009/0087791 A1* | 4/2009 | Sakamoto ............... 430/302 |
| 2009/0170028 A1* | 7/2009 | Loccufier et al. ......... 430/283.1 |

FOREIGN PATENT DOCUMENTS

| DE | 1447963 A1 | 11/1968 |
| DE | 4007428 A1 | 9/1991 |
| DE | 4027301 A1 | 3/1992 |
| DE | 4417907 A1 | 11/1995 |
| DE | 4423140 A1 | 1/1996 |
| DE | 4445820 A1 | 6/1996 |
| EP | 0291760 A2 | 11/1988 |
| EP | 0400706 A1 | 12/1990 |
| EP | 0625728 A2 | 11/1994 |
| EP | 0823327 A2 | 2/1998 |
| EP | 0864420 A1 | 9/1998 |
| EP | 0894622 A2 | 2/1999 |
| EP | 0901902 A2 | 3/1999 |
| EP | 0825927 B1 | 8/1999 |
| EP | 0933682 A2 | 8/1999 |
| EP | 0934822 A1 | 8/1999 |
| EP | 0950517 A1 | 10/1999 |
| EP | 0950518 A1 | 10/1999 |
| EP | 0978376 A2 | 2/2000 |
| EP | 0982123 A2 | 3/2000 |
| EP | 1029667 A1 | 8/2000 |
| EP | 1053868 A2 | 11/2000 |
| EP | 1072432 A2 | 1/2001 |
| EP | 1074386 A2 | 2/2001 |
| EP | 1074889 A2 | 2/2001 |

(Continued)

OTHER PUBLICATIONS

Computer translation of JP 2009086326 Apr. 2009.*
Hofmann, Volker, et al., "Pharmacologically Active Polymers, 11': Polymeric Sulfonamides as Potential Antibacterials and Carriers for Antitumol Agents," *Die Makromolekulare Chemie*, vol. 177, No. 5, pp. 1791-1813 (May 1976).
International Preliminary Report on Patentability in corresponding international Patent Application No. PCT/EP2012/052026, mailed Aug. 21, 2013.
International Search Report in corresponding International Patent Application No. PCT/EP2012/052026, mailed Mar. 26, 2012.

*Primary Examiner* — Chanceity Robinson
(74) *Attorney, Agent, or Firm* — Leydig, Voit & Mayer, Ltd.

(57) ABSTRACT

A positive-working lithographic printing plate precursor which comprises on a support having a hydrophilic surface or which is provided with a hydrophilic layer, a heat and/or light-sensitive coating comprising an infrared adsorbing agent and a binder including a monomeric unit including a salicylic acid group and a monomeric unit including a sulfonamide group.

20 Claims, No Drawings

(56) References Cited

FOREIGN PATENT DOCUMENTS

| | | | |
|---|---|---|---|
| EP | 1093934 A1 | 4/2001 |
| EP | 1342568 A1 | 9/2003 |
| EP | 1400351 A2 | 3/2004 |
| EP | 1506854 A1 | 2/2005 |
| EP | 1506858 A2 | 2/2005 |
| EP | 1614538 A2 | 1/2006 |
| EP | 1614539 A1 | 1/2006 |
| EP | 1614540 A1 | 1/2006 |
| EP | 1 826 001 A1 | 8/2007 |
| EP | 1916101 A2 | 4/2008 |
| EP | 1588220 B1 | 10/2008 |
| EP | 2 159 049 A1 | 3/2010 |
| GB | 1084070 | 9/1967 |
| GB | 1154749 | 6/1969 |
| JP | 2009014779 A | 1/2009 |
| JP | 2009086326 A * | 4/2009 |
| WO | WO 97/39894 | 10/1997 |
| WO | WO 99/01795 | 1/1999 |
| WO | WO 99/21715 | 5/1999 |
| WO | WO 99/63407 | 12/1999 |
| WO | WO 00/29214 | 5/2000 |
| WO | WO 00/32705 | 6/2000 |
| WO | WO 01/45958 A2 | 6/2001 |
| WO | WO 02/053627 A1 | 7/2002 |
| WO | WO 2004/030923 A2 | 4/2004 |
| WO | WO 2004/030924 A1 | 4/2004 |
| WO | WO 2004/030925 A1 | 4/2004 |
| WO | WO 2004/035310 A1 | 4/2004 |
| WO | WO 2004/035645 A1 | 4/2004 |
| WO | WO 2004/035686 A2 | 4/2004 |
| WO | WO 2004/035687 A1 | 4/2004 |
| WO | WO 2004/071767 A1 | 8/2004 |
| WO | WO 2005/111727 A1 | 11/2005 |
| WO | WO 2006/005688 A1 | 1/2006 |

* cited by examiner

LITHOGRAPHIC PRINTING PLATE PRECURSOR

CROSS-REFERENCE TO RELATED APPLICATIONS

This application is the U.S. National Phase of PCT/EP2012/052026, filed Feb. 7, 2012, claiming the benefit of European Patent Application No. 11155071.1 filed Feb. 18, 2011 and U.S. Provisional Patent Application No. 61/446,048, filed Feb. 24, 2011; the disclosures of the '026, '071, and '048 applications are incorporated by reference.

FIELD OF THE INVENTION

The present invention relates to a positive-working lithographic printing plate precursor.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the image-wise exposure and processing of an imaging material called plate precursor. In addition to the well-known photosensitive, so-called pre-sensitized plate precursors, which are suitable for UV contact exposure through a film mask, also heat-sensitive printing plate precursors have become very popular in the late 1990s. Such thermal materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-)chemical process, such as ablation, polymerization, insolubilization by crosslinking of a polymer, heat-induced solubilization or particle coagulation of a thermoplastic polymer latex.

The most popular thermal plates form an image by a heat-induced solubility difference in an alkaline developer between exposed and non-exposed areas of the coating. The coating typically comprises an oleophilic binder, e.g. a phenolic resin, of which the rate of dissolution in the developer is either reduced (negative working) or increased (positive working) by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in e.g. EP-A 625728, 823327, 825927, 864420, 894622 and 901902. Negative working embodiments of such thermal materials often require a pre-heat step between exposure and development as described in e.g. EP-625,728.

In the graphic arts industry, there is an evolution towards the use of recycled paper and more abrasive inks, fountain solutions and/or plate cleaners. These harsh printing conditions, especially occurring on web presses, not only impose more stringent demands on the chemical resistance of the printing plates towards pressroom chemicals and inks but also reduce their press life. To improve the chemical resistance and/or press life of positive-working plates based on oleophilic resins, often a heat-treatment is carried out after the exposure and development steps. However, this heat-treatment, also known as post-baking, is both energy and time consuming. Other solutions to these issues have been provided in the art by optimizing the coatings for example by selection of specific alkaline soluble resins—e.g. by chemical modification—and/or by providing double layer coatings. Such coatings typically include a first layer comprising a highly solvent resistant alkaline soluble resin and a second layer on top of this first layer comprising a phenolic resin for image formation. In addition, positive-working printing plate precursors based on a solubility difference may suffer from an insufficient development latitude, i.e. the dissolution of the exposed areas in the developer is not completely finished before the unexposed areas also start dissolving in the developer. This often results in insufficient clean-out leading to toning (ink-acceptance at the non-image areas), a loss of coating (small image details) at the image areas, a reduced press life and/or a reduced chemical resistance of the printing plate. An optimized lithographic latitude requires an excellent clean-out of the non-image parts upon processing while maintaining an excellent run length performance and image quality. Both run length and clean-out performance are determined by the interaction between the heat-sensitive coating and the substrate. An optimal run length requires adhesion between the substrate and the heat sensitive layer in the image parts, while clean-out requires minimal interaction in the non-image parts upon processing. As a result, maximizing the clean-out performance often results in image attack and reduced image quality, such as an increased undercutting in double layer plates. Therefore, there is still a need for new coatings satisfying both runlength and clean-out requirements at the same time.

EP 1 826 001 and EP 2 159 049 disclose a heat-sensitive, positive-working lithographic printing plate precursor comprising on a support having a hydrophilic surface or which is provided with a hydrophilic layer a heat-sensitive coating comprising an IR absorbing agent, a phenolic resin and a polymer including a monomeric unit having a sulfonamide group.

WO 02/053627, US 04/0023155 and US 02/160299 disclose a positive working lithographic printing plate precursor comprising a thermally sensitive supramolecular polymer which may include a base soluble group such as a phenolic group and/or a carboxylic acid group.

JP2009086326 and JP2009014779 disclose a lithographic printing plate including an intermediate layer between the aluminium support and the image forming layers including a specified polymer including a monomeric unit having an aromatic group containing hydroxyl and carboxyl substituents.

SUMMARY OF THE INVENTION

It is an object of the present invention to provide a positive-working lithographic printing plate precursor characterized by a good-clean out and a high press life.

The object of the present invention is realized by a lithographic printing plate precursor, which comprises on a support having a hydrophilic surface or which is provided with a hydrophilic layer, a heat and/or light-sensitive coating including an infrared absorbing agent and a binder including a monomeric unit including a salicylic acid group and a monomeric unit including a sulfonamide group.

Other features, elements, steps, characteristics and advantages of the present invention will become more apparent from the following detailed description. Specific embodiments of the invention are also defined in the dependent claims.

DETAILED DESCRIPTION OF THE INVENTION

The lithographic printing plate precursor according to the present invention comprises a heat and/or light sensitive coating and is positive-working, i.e. after exposure and development the exposed areas of the coating are removed from the support and define hydrophilic (non-printing) areas, whereas the unexposed coating is not removed from the support and defines oleophilic (printing) areas.

The binder according to the present invention comprises a monomeric unit including a salicylic acid group. The monomeric unit including a salicylic acid group is preferably presented by structure I:

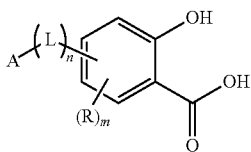

Structure I wherein

A represents a structural moiety comprising at least one polymerizable ethylenically unsaturated group;

L represent a divalent linking group;

n represents 0 or 1;

m represents 0, 1, 2 or 3;

R represents a halogen, an optionally substituted alkyl, alkenyl, alkynyl, aralkyl, alkaryl, aryl, heteroaryl, ether, hydroxyl, ester, amine, amide, thioether, sulfoxide, sulfone, thiol, nitro, nitrile, carboxylic acid or sulfonamide group, two R-groups may represent the necessary atoms to form a five to eight membered ring.

The structural moiety A comprising at least one polymerizable ethylenically unsaturated group is preferably represented by a vinyl, vinyl ether, allyl, acryl, methacryl, acrylamide, methacrylamide, maleimide, norbornene functionalised maleimide or a cycloalkenyl group such as cyclopentenyl or cyclopentadienyl.

More preferably, the structural moiety A comprising at least one polymerizable ethylenically unsaturated group is represented by an acryl, methacryl, acrylamide, methacrylamide or maleimide group.

Most preferably, the structural moiety A comprising an ethylenically polymerisable group represents one of the following structures:

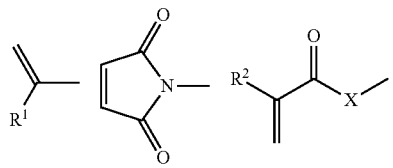

wherein
$R^1$ represent hydrogen, an alkyl group or —$COOR^3$ wherein $R^3$ represents an alkyl group; and
$R^2$ represents hydrogen or an alkyl group and X represents —O— or —$NR^4$ wherein $R^4$ represents hydrogen or an alkyl group.

The alkyl group which may be present in $R^1$ to $R^4$ preferably represents a methyl, ethyl, propyl, isopropyl, isobutyl or t-butyl group.

In a preferred embodiment, the monomer unit comprising at least one salicylic acid group is represented by structure II:

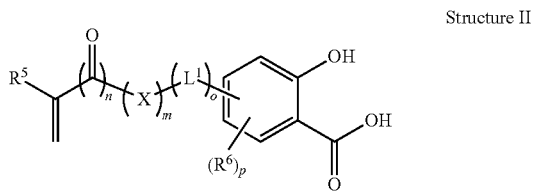

Structure II wherein:

$R^5$ represents hydrogen, an alkyl group or —$COOR^7$ wherein $R^7$ represents an alkyl group; the alkyl group preferably represents methyl, ethyl, propyl, isopropyl, isobutyl or t-butyl; and preferably $R^5$ represents hydrogen or a methyl group;

X represents —O—, —$NR^8$— or —S—, wherein $R^8$ represents hydrogen or an alkyl group such as methyl, ethyl, propyl, isopropyl, isobutyl, t-butyl, etc.; preferably X represents —O— or —$NR^8$—; most preferably X represents —NH—;

$L^1$ represent a divalent linking group;

$R^6$ represents a halogen, an optionally substituted alkyl, alkenyl, alkynyl, aralkyl, alkaryl, aryl, heteroaryl, ether, hydroxyl, ester, amine, amide, thioether, sulfoxide, sulfone, thiol, nitro, nitrile, carboxylic acid or sulfonamide group, two $R^6$-groups may represent the necessary atoms to form a five to eight membered ring;

m, n and o independently represent 0 or 1; preferably m and n are equal to 1;

p represents an integer equal to 0, 1, 2 or 3; preferably p represents 0.

The divalent linking groups L and $L^1$ independently represent an optionally substituted alkylene, arylene or heteroarylene, —O—, —CO—, —CO—O—, —O—CO—, —CS—, —O—$(CH_2)_k$—, —$(CH_2)_k$—O—, —$(CH_2)_k$—O—CO—, —O—CO—$(CH_2)_k$—, —$(CH_2)_k$—O—CO—$(CH_2)_l$—, —$(CH_2)_k$—COO—, —CO—O—$(CH_2)_k$—, —$(CH_2)_k$—COO—$(CH_2)_l$—, —$(CH_2)_k$—NH—, —NH—$(CH_2)_k$—, —$(CH_2)_k$—CONH—, —$(CH_2)_k$—CONH—$SO_2$—, —NH—$(CH_2)_k$—O—$(CH_2)_l$—, —CO—$(CH_2)_k$, —$(CH_2)_k$—CO—, —CO—NH—, —NH—CO—, —NH—CO—O—, —O—CO—NH—, —$(CH_2)_k$—CO—NH—, —NH—CO—(CH$_2$)$_k$—, —NH—CO—NH—, —NH—CS—NH—, —SO—, —SO$_2$—, —CH=N—, —NH—NH—, —(CH$_2$)$_k$—NHCO—, or combinations thereof; and wherein k and l independently represent 0 or an integer equal to or greater than 1, and the substituents optionally present on the alkylene, the arylene or the heteroarylene group may be represented by an alkyl group, a halogen such as a chlorine or bromine atom, a hydroxyl group, an amino group, (di)alkylamino group, an alkoxy group, a phosphonic acid group or a salt thereof.

In a preferred embodiment the binder according to the present invention comprises a monomeric unit derived from a monomer according to formula II wherein R$^5$ represents hydrogen or a methyl group, n and m are equal to 1, p is equal to 0, X represents —NH— and L$^1$ represents an optionally substituted alkylene, arylene, alkarylene or aralkylene group or combinations thereof.

Typical examples of monomers comprising at least one salicylic acid moiety are given below without being limited thereto.

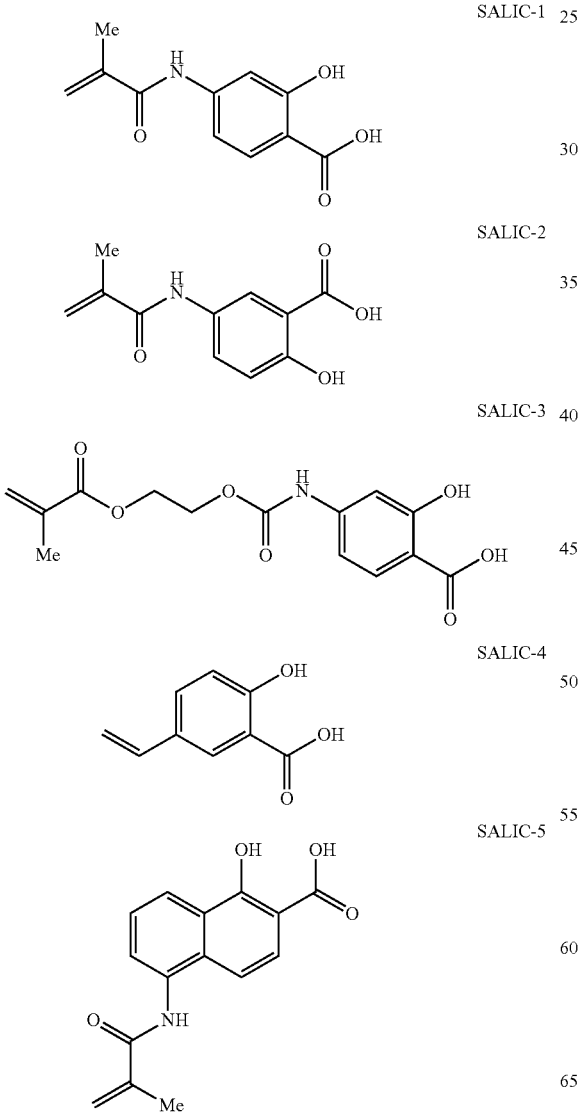

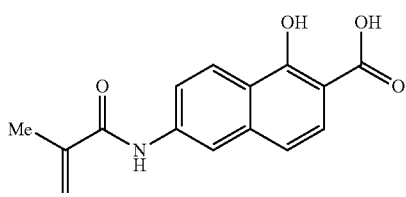

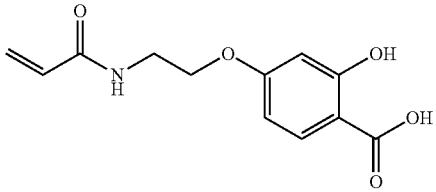

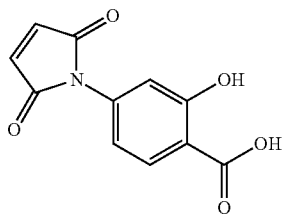

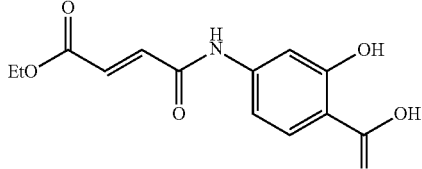

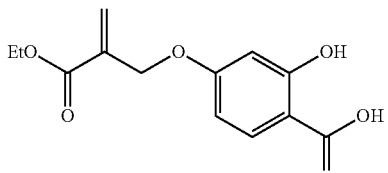

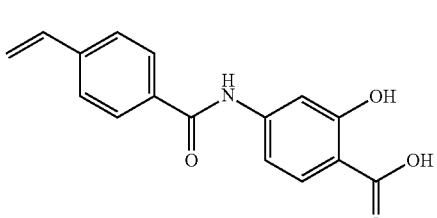

The binder according to the present invention further includes a monomeric unit including a sulfonamide group. The monomeric unit containing a sulfonamide group is preferably a monomeric unit including a sulfonamide group represented by —NR$^j$—SO$_2$—, —SO$_2$—NR$^k$— wherein R$^j$ and R$^k$ each independently represent hydrogen, an optionally substituted alkyl, alkanoyl, alkenyl, alkynyl, cycloalkyl, heterocyclic, aryl, heteroaryl, aralkyl, alkaryl, heteroaralkyl group or combinations thereof.

The monomeric unit including a sulfonamide group is more preferably derived form the monomer according to structure III.

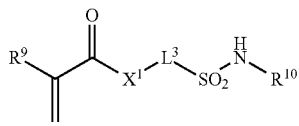

Structure III wherein $R^9$ represents hydrogen or an alkyl group;

$X^1$ represents —O— or —$NR^{11}$— wherein $R^{11}$ represents hydrogen, an optionally substituted alkyl, alkenyl, alkynyl, aralkyl alkaryl, aryl or heteroaryl group;

$L^3$ represents an optionally substituted alkylene, arylene, alkarylene, aralkylene group or hetero-arylene, —O—$(CH_2)_{k'}$—, —$(CH_2)_{l'}$—O—, or combinations thereof, wherein k' and l' independently represent an integer greater than 0;

$R^{10}$ represents hydrogen, an optionally substituted alkyl group such as methyl, ethyl, propyl or isopropyl, a cycloalkyl group such as cyclopentane, cyclohexane, 1,3-dimethylcyclohexane, alkenyl, alkynyl, aralkyl, alkaryl, an aryl group such as benzene, naphthalene or antracene, or a heteroaryl group such as furan, thiophene, pyrrole, pyrazole, imidazole, 1,2,3-triazole, 1,2,4-triazole, tetrazole, oxazole, isoxazole, thiazole, isothiazole, thiadiazole, oxadiazole, pyridine, pyridazine, pyrimidine, pyrazine, 1,3,5-triazine, 1,2,4-triazine or 1,2,3-triazine, benzofuran, benzothiophene, indole, indazole, benzoxazole, quinoline, quinazoline, benzimidazole or benztriazole or an acyl group.

In a preferred embodiment the monomeric unit including a sulfonamide group is derived form the monomer according to structure III wherein $X^1$ represents —$NR^{11}$— and $R^{11}$ represents hydrogen or an optionally substituted alkyl group, and $L^3$ represents a hetero-arylene, aralkylene, alkarylene or an arylene group.

In a more preferred embodiment the monomeric unit including a sulfonamide group is derived form the monomer according to structure III wherein $X^1$ represents —NH— and $L^3$ represents an arylene group.

The optional substituents on the groups above may be selected from an alkyl, cycloalkyl, alkenyl or cyclo alkenyl group, an aryl or heteroaryl group, halogen, an alkylaryl or arylalkyl group, an alkoxy or aryloxy group, a thio alkyl, thio aryl or thio heteroaryl group, a hydroxyl group, —SH, a carboxylic acid group or an ester thereof, a sulphonic acid group or an ester thereof, a phosphonic acid group or an ester thereof, a phosphoric acid group or an ester thereof, an amino group, a sulfonamide group, an amide group, a nitro group, a nitrile group, or a combination of at least two of these groups, including at least one of these groups which is further substituted by one of these groups.

Further suitable examples of sulfonamide polymers and/or their method of preparation are disclosed in EP 933 682, EP 982 123, EP 1 072 432, WO 99/63407 and EP 1 400 351, WO 07/099,047 and EP 2 159 049. Without being limited thereto, typical sulfonamide monomeric units are given below as monomers:

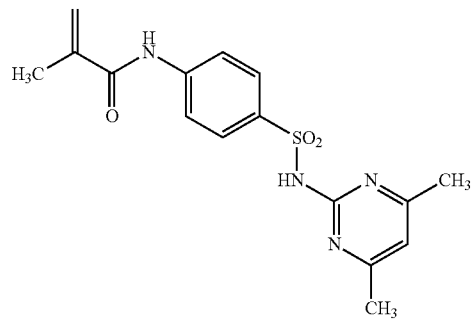

SULF-1

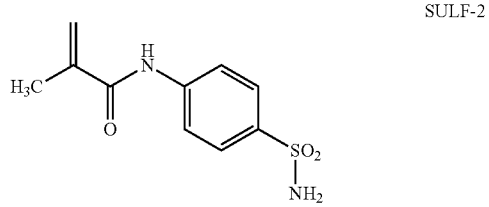

SULF-2

SULF-3

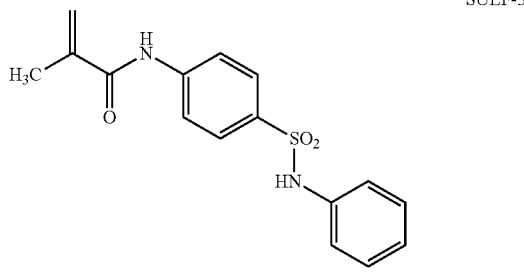

SULF-4

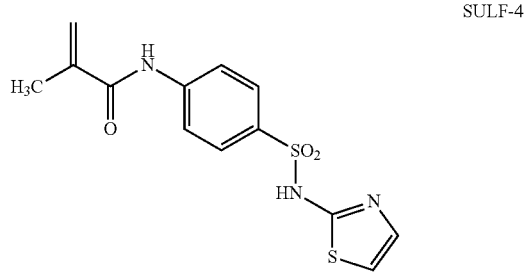

SULF-5

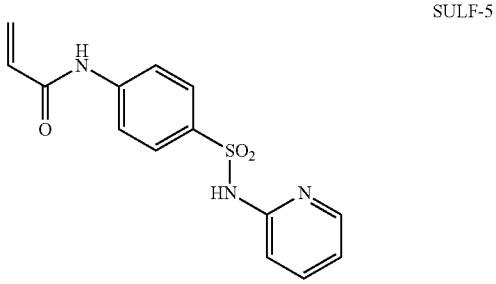

SULF-6

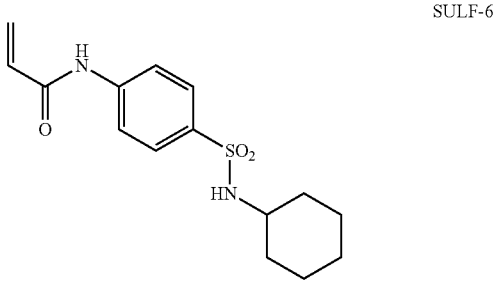

SULF-7
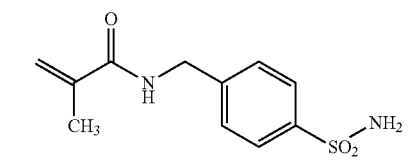

SULF-8
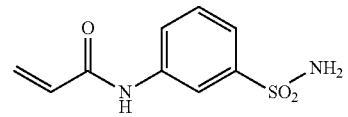

SULF-9
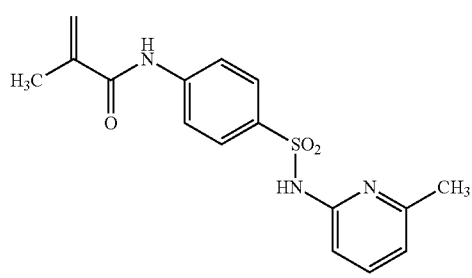

SULF-10
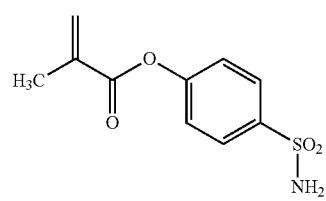

SULF-11
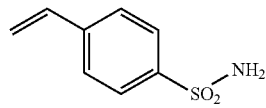

SULF-12
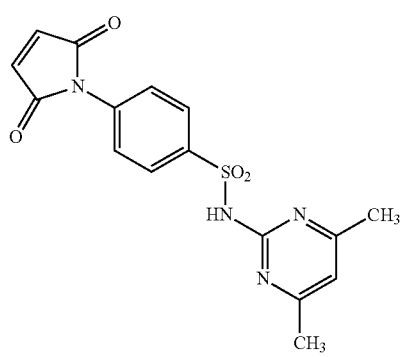

SULF-13
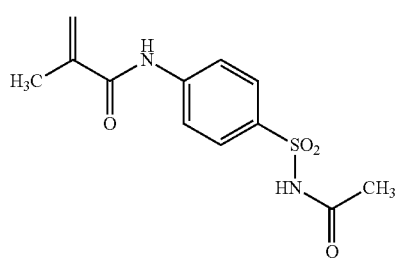

SULF-14
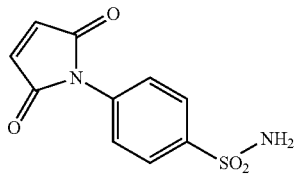

SULF-15
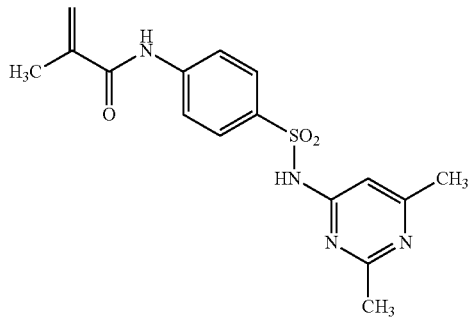

SULF-16

SULF-17
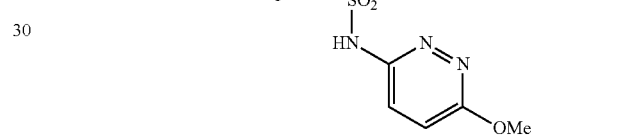

SULF-18
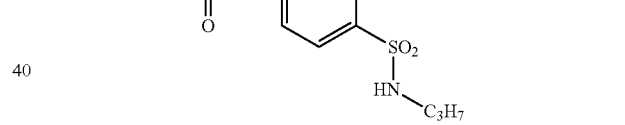

SULF-19
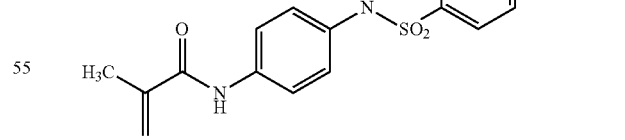

The binder according to the present invention may further comprise one or more other monomeric units, preferably selected from an acrylate or methacrylate e.g. an alkyl or aryl (meth)acrylate such as methyl (meth)acrylate, ethyl (meth)acrylate, butyl (meth)acrylate, benzyl (meth)acrylate, 2-phenylethyl (meth)acrylate, hydroxyethyl (meth)acrylate, phenyl (meth)acrylate or N-(4-metylpyridyl)(meth)acrylate; (meth)acrylic acid; a (meth)acrylamide e.g. (meth)acrylamide or a N-alkyl or N-aryl (meth)acrylamide such as N-methyl (meth)acrylamide, N-ethyl (meth)acrylamide, N-phenyl (meth)acrylamide, N-benzyl (meth)acrylamide, N-methylol (meth)acrylamide, N-(4-hydroxyphenyl)(meth)acrylamide; (meth)acrylonitrile; styrene; a substituted styrene such as 2-, 3- or 4-hydroxy-styrene, 4-carboxy-styrene ester; a vinylpyridine such as 2-vinylpyridine, 3-vinylpyridine, 4-vinylpyridine; a substituted vinylpyridine such as 4-methyl-2-vinylpyridine; vinyl acetate, optionally the copolymerised vinyl acetate monomeric units are at least partially hydrolysed, forming an alcohol group, and/or at least partially reacted by an aldehyde compound such as formaldehyde or butyraldehyde, forming an acetal or butyral group; vinyl alcohol; vinyl nitrile; vinyl acetal; vinyl butyral; a vinyl ether such as methyl vinyl ether; vinyl amide; a N-alkyl vinyl amide such as N-methyl vinyl amide, caprolactame, vinyl pyrrolydone; maleic anhydride, a maleimide e.g. maleimide or a N-alkyl or N-aryl maleimide such as N-benzyl maleimide.

In a preferred embodiment, the binder further comprises monomeric units selected from a (meth)acrylamide such as (meth)acrylamide, phenyl (meth)acrylamide, benzyl (meth)acrylamide, phenityl (meth)acrylamide and methylol (meth)acrylamide; (meth)acrylic acid; a maleimide e.g. maleimide or a N-alkyl or N-aryl maleimide such as N-benzyl maleimide, (meth)acrylates such as methyl (meth)acrylate, phenyl (meth)acrylate, hydroxyethyl (meth)acrylate or benzyl (meth)acrylate; vinyl nitrile or vinyl pyrrolidone.

In a highly preferred embodiment the binder according to the present invention comprises
  a monomeric unit according to the structure II wherein $R^5$ represents hydrogen or an alkyl group, n, m and o represent 1 and p represent 0, X represents —NH— and $L^1$ represents an optionally substituted arylene, —O—$(CH_2)_{k'}$—, —$(CH_2)_{l'}$—O—, wherein k' and l' independently represent an integer greater than 0, —CO—NH—, —NH—CO— and/or combinations thereof;
  a monomeric unit including a sulfonamide group derived form the monomer according to structure III wherein $X^1$ represents —NH—, $L^3$ represents an alkylene, heteroarylene, aralkylene, alkarylene or an arylene group, $R^9$ represents hydrogen or an alkyl group and $R^{10}$ represents hydrogen, or an optionally substituted aryl or heteroaryl group; and
  and optionally a monomeric unit derived from (meth)acrylamide monomer such as alkyl (meth)acrylamide, phenyl (meth)acrylamide, benzyl (meth)acrylamide and methylol (meth)acrylamide.

In a second highly preferred embodiment the binder according to the present invention comprises
  a monomeric unit according to the structure II wherein $R^5$ represents hydrogen or an alkyl group, n and m represent 1, o and p represent 0, and X represents —NH—;
  a monomeric unit including a sulfonamide group derived form the monomer according to structure III wherein $X^1$ represents —NH—, $L^3$ represents an alkylene, heteroarylene, aralkylene, alkarylene or an arylene group, $R^9$ represents hydrogen or an alkyl group and $R^{10}$ represents hydrogen, or an optionally substituted aryl or heteroaryl aryl group; and
  and optionally a monomeric unit derived from (meth)acrylamide monomer such as alkyl (meth)acrylamide, phenyl (meth)acrylamide, benzyl (meth)acrylamide and methylol (meth)acrylamide.

The amount of the monomeric unit comprising at least one salicylic acid group in the binder is comprised between 2 and 15 mol %, preferably between 3 and 12 mol % and most preferably between 4 and 10 mol %. The amount of the monomeric unit including a sulfonamide monomer in the binder is preferably between 35 and 75 mol %, more preferably between 40 and 70 mol % and most preferably between 45 and 65 mol %. The binder according to the present invention preferably has a molecular weight ranging $M_n$ i.e. number average molecular weight, between 10000 and 150000, more preferably between 15000 and 100000, most preferably between 20000 and 80000, and $M_w$ i.e. weight average molecular weight, between 10000 and 500000, more preferably between 30000 and 300000, most preferably between 40000 and 280000. These molecular weights are determined by the method as described in the Examples.

Optionally, the coating may further comprise one or more binders selected from hydrophilic binders such as homopolymers and copolymers of vinyl alcohol, (meth)acrylamide, methylol (meth)acrylamide, (meth)acrylic acid, hydroxyethyl (meth)acrylate, maleic anhydride/vinylmethylether copolymers, copolymers of (meth)acrylic acid or vinylalcohol with styrene sulphonic acid; hydrophobic binders such as phenolic resins (e.g. novolac, resoles or polyvinyl phenols); chemically modified phenolic resins or polymers containing a carboxyl group, a nitrile group or a maleimide group as described in DE 4 007 428, DE 4 027 301 and DE 4 445 820; polymers having an active imide group such as —$SO_2$—NH—CO—$R^h$, —$SO_2$—NH—$SO_2$—$R^h$ or —CO—NH—$SO_2$—$R^h$ wherein $R^h$ represents an optionally substituted hydrocarbon group such as an optionally substituted alkyl, aryl, alkaryl, aralkyl or heteroaryl group; polymers comprising a N-benzyl-maleimide monomeric unit as described in EP 933 682, EP 894 622 (page 3 line 16 to page 6 line 30), EP 982 123 (page 3 line 56 to page 51 line 5), EP 1 072 432 (page 4 line 21 to page 10 line 29) and WO 99/63407 (page 4 line 13 to page 9 line 37); polymers having an acidic group which can be selected from polycondensates and polymers having free phenolic hydroxyl groups, as obtained, for example, by reacting phenol, resorcinol, a cresol, a xylenol or a trimethylphenol with aldehydes, especially formaldehyde, or ketones; condensates of sulfamoyl- or carbamoyl-substituted aromatics and aldehydes or ketones; polymers of bismethylol-substituted ureas, vinyl ethers, vinyl alcohols, vinyl acetals or vinylamides and polymers of phenylacrylates and copolymers of hydroxy-phenylmaleimides; polymers having units of vinylaromatics, N-aryl(meth)acrylamides or aryl (meth)acrylates containing optionally one or more carboxyl groups, phenolic hydroxyl groups, sulfamoyl groups or carbamoyl groups such as polymers having units of 2-hydroxyphenyl (meth)acrylate, of N-(4-hydroxyphenyl)(meth)acrylamide, of N-(4-sulfamoylphenyl)-(meth)acrylamide, of N-(4-hydroxy-3,5-dimethylbenzyl)-(meth)acrylamide, or 4-hydroxystyrene or of hydroxyphenylmaleimide; vinylaromatics, methyl (meth)acrylate, phenyl(meth)acrylate, benzyl (meth)acrylate, methacrylamide or acrylonitrile.

Typical generic structures of binders, according to the present invention are given below, without being limited thereto.

Binder 1
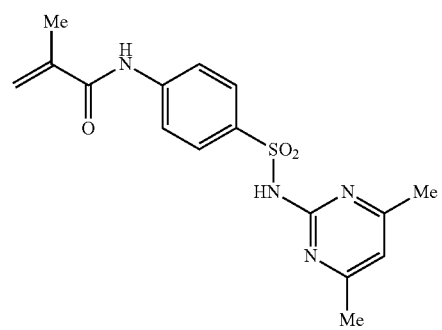
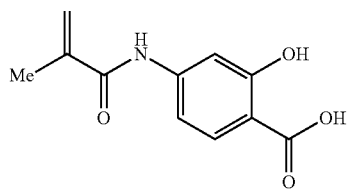
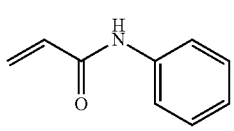
Binder2
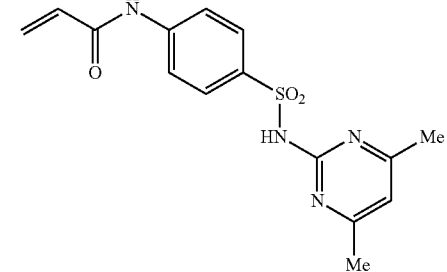
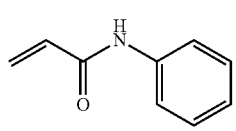
Binder 3
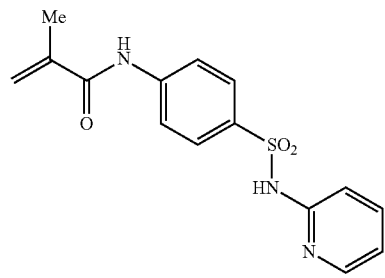
-continued
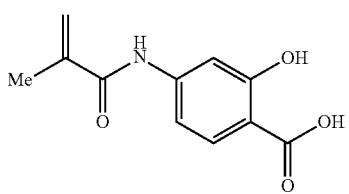
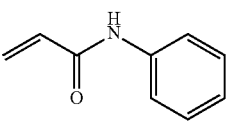
Binder 4
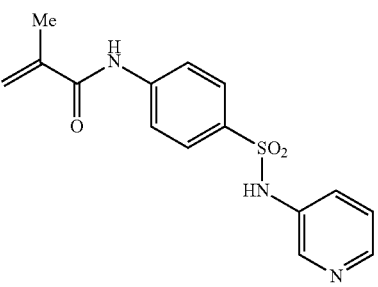
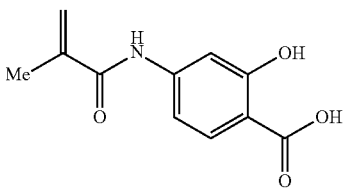
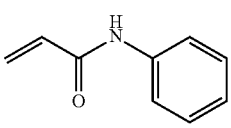
Binder 5
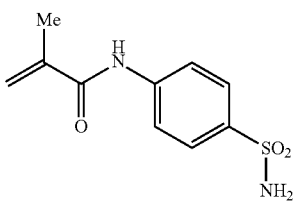
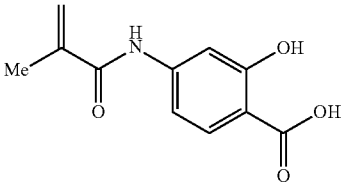
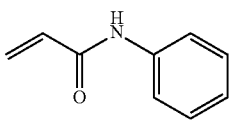

15
-continued
Binder 6
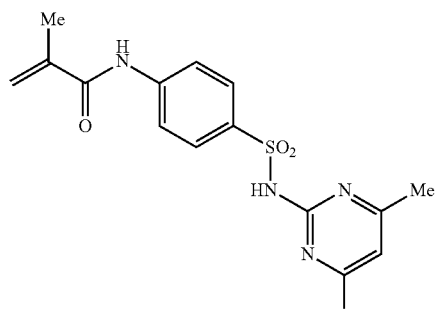
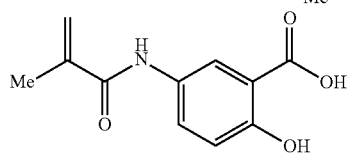
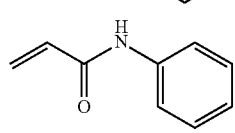
Binder 7
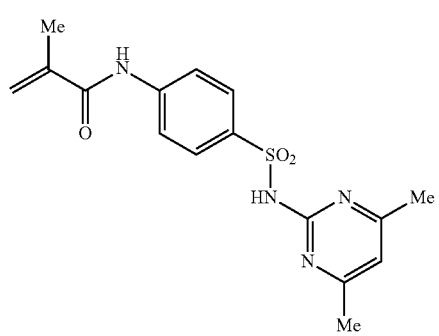
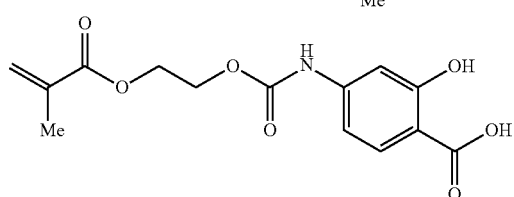
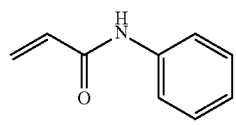
Binder 8
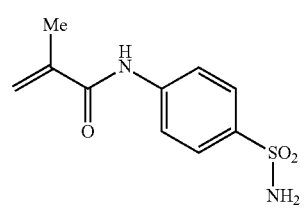
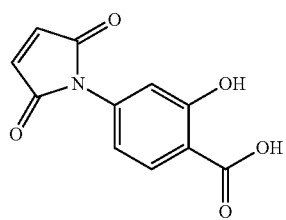
16
-continued
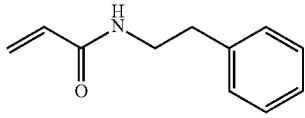
Binder 9
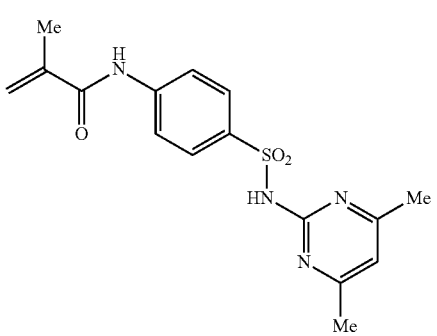
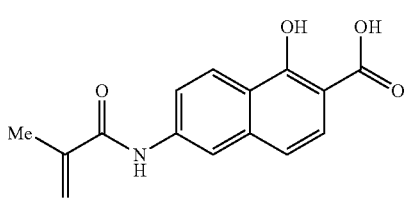
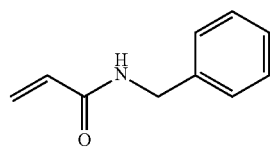
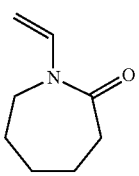
Binder 10
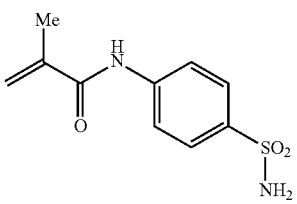
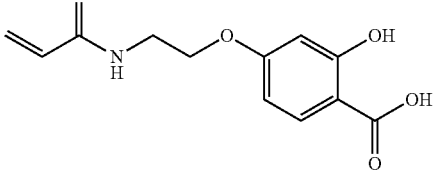
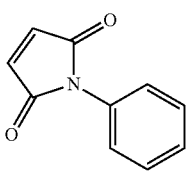

Binder 11

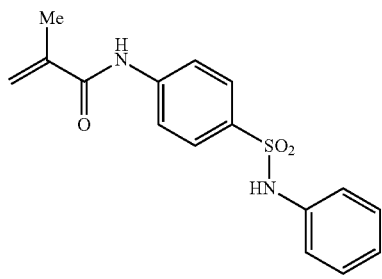

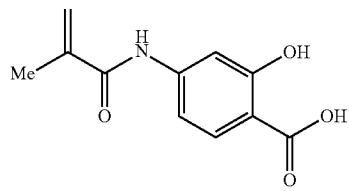

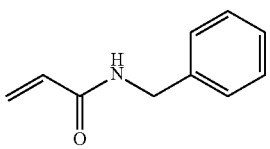

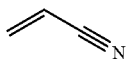

The lithographic printing plate precursor preferably comprises a contrast dye according to Structure IV:

Structure IV

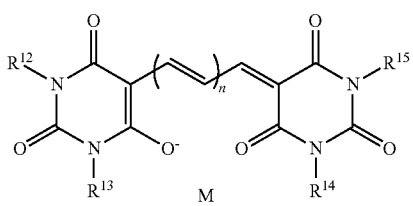

wherein
$R^{12}$ to $R^{15}$ independently represent an optionally substituted alkyl, alkenyl, alkynyl, aryl or heteroaryl group;
n represents 1 or 2; preferably n represents 2;
M represents a cationic group having a charge at an amount equal to compensate the negative charge of the chromophore.

Preferably $R^{12}$ to $R^{15}$ represent an optionally substituted alkyl group such as a methyl, ethyl, propyl or butyl group and M represents an organic cation such as the salt of a tertiary amine.

A highly preferred contrast dye is represented by structure V:

Structure V

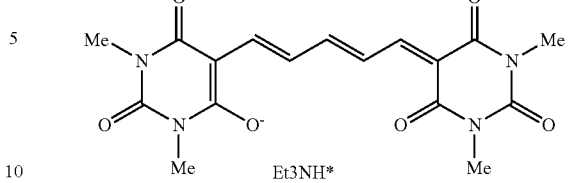

The coating may comprise more than one layer. Preferably, the coating comprises at least two layers; a first layer comprising the resin according to the present invention—further also referred to as the first layer, and a second layer comprising a phenolic resin located above said first layer—further also referred to as the second layer. First layer means that the layer is, compared to the second layer, located closer to the lithographic support. The binder of the present invention present in the first layer may also be present in the second layer but is preferably only present in the first layer. The phenolic resin is an alkaline soluble oleophilic resin. The phenolic resin is preferably selected from a novolac, a resol or a polyvinylphenolic resin; novolac is more preferred. Typical examples of such polymers are described in DE-A-4007428, DE-A-4027301 and DE-A-4445820. Other preferred polymers are phenolic resins wherein the phenyl group or the hydroxy group of the phenolic monomeric unit are chemically modified with an organic substituent as described in EP 894 622, EP 901 902, EP 933 682, WO99/63407, EP 934 822, EP 1 072 432, U.S. Pat. No. 5,641,608, EP 982 123, WO99/01795, WO04/035310, WO04/035686, WO04/035645, WO04/035687 or EP 1 506 858.

Examples of suitable phenolic resins are ALNOVOL SPN452, ALNOVOL SPN400 and ALNOVOL HPN100 (all commercial available from CLARIANT GmbH); DURITE PD443, DURITE SD423A and DURITE SD126A (all commercial available from BORDEN CHEM. INC.); BAKELITE 6866LB02 and BAKELITE 6866LB03 (both commercial available from BAKELITE AG.); KR 400/8 (commercial available from KOYO CHEMICALS INC.); HRJ 1085 and HRJ 2606 (commercially available from SCHNECTADY INTERNATIONAL INC.) and LYNCUR CMM (commercially available from SIBER HEGNER).

The amount of binder according to the present invention in the coating is preferably above 15% wt, more preferably above 20% wt and most preferably above 30% wt relative to the total weight of all ingredients in the coating. Alternatively, the amount of binder according to the present invention is preferably more than 75% wt; more preferably more than 85% wt and most preferably more than 95% wt. In the embodiment where the coating comprises two layers, the resin according to the present invention is preferably present in the coating in an amount comprised between 15% wt and 85% wt, more preferably in an amount between 20% wt and 75% wt and most preferably between 30% wt and 65% wt.

The dissolution behavior of the two-layer coating—i.e. the coating comprising the first layer, the second layer and/or optional other layer—in the developer can be fine-tuned by optional solubility regulating components. More particularly, development accelerators and development inhibitors can be used. These ingredients are preferably added to the second layer.

Development accelerators are compounds which act as dissolution promoters because they are capable of increasing the dissolution rate of the coating. Developer resistance means, also called development inhibitors, are compounds which are capable of delaying the dissolution of the unexposed areas during processing. The dissolution inhibiting effect is preferably reversed by heating, so that the dissolution of the exposed areas is not substantially delayed and a large dissolution differential between exposed and unexposed areas can thereby be obtained. The compounds described in e.g. EP 823 327 and WO 97/39894 are believed to act as dissolution inhibitors due to interaction, e.g. by hydrogen bridge formation, with the alkali-soluble resin(s) in the coating. Inhibitors of this type typically comprise at least one hydrogen bridge forming group such as nitrogen atoms, onium groups, carbonyl (—CO—), sulfinyl (—SO—) or sulfonyl (—SO$_2$—) groups and a large hydrophobic moiety such as one or more aromatic rings. Some of the compounds mentioned below, e.g. infrared dyes such as cyanines and contrast dyes such as quaternized triarylmethane dyes can also act as a dissolution inhibitor.

Other suitable inhibitors improve the developer resistance because they delay the penetration of the aqueous alkaline developer into the coating. Such compounds can be present in the imaging layer and/or in an optional second layer as described in e.g. EP 950 518, and/or in an optional development barrier layer on top of said layer as described in e.g. EP 864 420, EP 950 517, WO 99/21725 and WO 01/45958. In the latter embodiment, the solubility of the barrier layer in the developer or the penetrability of the barrier layer by the developer can be increased by exposure to heat or infrared light.

Preferred examples of inhibitors which delay the penetration of the aqueous alkaline developer into the coating include (i) polymeric materials which are insoluble in or impenetrable by the developer, (ii) bifunctional compounds such as surfactants comprising a polar group and a hydrophobic group such as a long chain hydrocarbon group, a poly- or oligosiloxane and/or a perfluorinated hydrocarbon group such as Megafac F-177, a perfluorinated surfactant available from Dainippon Ink & Chemicals, Inc., (iii) bifunctional block-copolymers comprising a polar block such as a poly- or oligo(alkylene oxide) and a hydrophobic block such as a long chain hydrocarbon group, a poly- or oligosiloxane and/or a perfluorinated hydrocarbon group such as Tego Glide 410, Tego Wet 265, Tego Protect 5001 or Silikophen P50/X, all commercially available from Tego Chemie, Essen, Germany.

The coating of the heat-sensitive printing plate precursors described above preferably also contains an infrared light absorbing dye or pigment which may be present in the first layer, the second layer and/or in an optional other layer. Preferred IR absorbing dyes are cyanine dyes, merocyanine dyes, indoaniline dyes, oxonol dyes, pyrilium dyes and squarilium dyes. Examples of suitable IR dyes are described in e.g. EP-As 823327, 978376, 1029667, 1053868, 1093934; WO 97/39894 and 00/29214. A preferred compound is the following cyanine dye:

IR-1

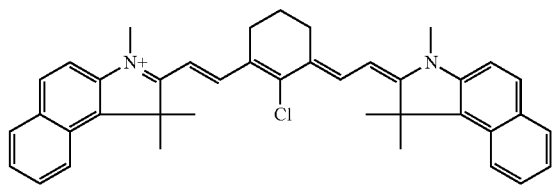

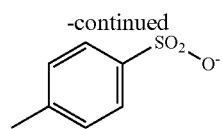

The concentration of the IR-dye in the coating is preferably between 0.25 and 15.0% wt, more preferably between 0.5 and 10.0% wt, most preferably between 1.0 and 7.5% wt relative to the coating as a whole.

The coating may further comprise one or more colorant(s) such as dyes or pigments which provide a visible color to the coating and which remain in the coating at the image areas which are not removed during the processing step. Thereby a visible image is formed and examination of the lithographic image on the developed printing plate becomes feasible. Such dyes are often called contrast dyes or indicator dyes. Preferably, the dye has a blue color and an absorption maximum in the wavelength range between 600 nm and 750 nm. Typical examples of such contrast dyes are the amino-substituted tri- or diarylmethane dyes, e.g. crystal violet, methyl violet, victoria pure blue, flexoblau 630, basonylblau 640, auramine and malachite green. Also the dyes which are discussed in depth in EP-A 400,706 are suitable contrast dyes. Dyes which, combined with specific additives, only slightly color the coating but which become intensively colored after exposure, as described in for example WO2006/005688 may also be used as colorants.

Optionally, the coating may further contain additional ingredients. These ingredients may be present in the first, second or in an optional other layer. For example, polymer particles such as matting agents and spacers, surfactants such as perfluoro-surfactants, silicon or titanium dioxide particles, colorants, metal complexing agents are well-known components of lithographic coatings.

To protect the surface of the coating, in particular from mechanical damage, a protective layer may optionally be applied on top of the coating. The protective layer generally comprises at least one water-soluble polymeric binder, such as polyvinyl alcohol, polyvinylpyrrolidone, partially hydrolyzed polyvinyl acetates, gelatin, carbohydrates or hydroxyethylcellulose. The protective layer may contain small amounts, i.e. less then 5% by weight, of organic solvents. The thickness of the protective layer is not particularly limited but preferably is up to 5.0 µm, more preferably from 0.05 to 3.0 µm, particularly preferably from 0.10 to 1.0 µm.

The coating may further contain other additional layer(s) such as for example an adhesion-improving layer located between the first layer and the support.

The lithographic printing plate used in the present invention comprises a support which has a hydrophilic surface or which is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate comprising an aluminum foil and a plastic layer, e.g. polyester film.

A particularly preferred lithographic support is an electrochemically grained and anodized aluminum support. The aluminum support has usually a thickness of about 0.1-0.6 mm. However, this thickness can be changed appropriately depending on the size of the printing plate used and/or the size of the plate-setters on which the printing plate precursors are exposed. The aluminium is preferably grained by electrochemical graining, and anodized by means of anodizing techniques employing phosphoric acid or a sulphuric acid/phosphoric acid mixture. Methods of both graining and anodization of aluminum are very well known in the art.

By graining (or roughening) the aluminum support, both the adhesion of the printing image and the wetting characteristics of the non-image areas are improved. By varying the type and/or concentration of the electrolyte and the applied voltage in the graining step, different type of grains can be obtained. The surface roughness is often expressed as arithmetical mean center-line roughness Ra (ISO 4287/1 or DIN 4762) and may vary between 0.05 and 1.5 µm. The aluminum substrate of the current invention has preferably an Ra value below 0.45 µm, more preferably below 0.40 µm, even more preferably below 0.30 µm and most preferably below 0.25 µm. The lower limit of the Ra value is preferably about 0.1 µm. More details concerning the preferred Ra values of the surface of the grained and anodized aluminum support are described in EP 1 356 926.

By anodising the aluminum support, its abrasion resistance and hydrophilic nature are improved. The microstructure as well as the thickness of the $Al_2O_3$ layer are determined by the anodising step, the anodic weight (g/m$^2$ $Al_2O_3$ formed on the aluminium surface) varies between 1 and 8 g/m$^2$. The anodic weight is preferably ≥3 g/m$^2$, more preferably ≥3.5 g/m$^2$ and most preferably ≥4.0 g/m$^2$.

The grained and anodized aluminum support may be subject to a so-called post-anodic treatment to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde. It is further evident that one or more of these post-treatments may be carried out alone or in combination. More detailed descriptions of these treatments are given in GB-A 1 084 070, DE-A 4 423 140, DE-A 4 417 907, EP-A 659 909, EP-A 537 633, DE-A 4 001 466, EP-A 292 801, EP-A 291 760 and U.S. Pat. No. 4,458,005. A silicated aluminium support is particularly preferred.

The support can also be a flexible support, which may be provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 µm and is preferably 1 to 10 µm. More details of preferred embodiments of the base layer can be found in e.g. EP-A 1 025 992.

Any coating method can be used for applying two or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch. However it is not necessary (and may not even be possible) to remove all the solvent in the drying step. Indeed the residual solvent content may be regarded as an additional composition variable by means of which the composition may be optimized. Drying is typically carried out by blowing hot air onto the coating, typically at a temperature of at least 70° C., suitably 80-150° C. and especially 90-140° C. Also infrared lamps can be used. The drying time may typically be 15-600 seconds.

Between coating and drying, or after the drying step, a heat treatment and subsequent cooling may provide additional benefits, as described in WO99/21715, EP-A 1074386, EP-A 1074889, WO00/29214, and WO/04030923, WO/04030924, WO/04030925.

The heat-sensitive plate precursor can be image-wise exposed directly with heat, e.g. by means of a thermal head, or indirectly by infrared light, preferably near infrared light. The infrared light is preferably converted into heat by an IR light absorbing compound as discussed above. The printing plate precursor is positive working and relies on heat-induced solubilization of the binder of the present invention. The binder is preferably a polymer that is soluble in an aqueous developer, more preferably an aqueous alkaline developing solution with a pH between 7.5 and 14.

The printing plate precursor can be exposed to infrared light by means of e.g. LEDs or a laser. Most preferably, the light used for the exposure is a laser emitting near infrared light having a wavelength in the range from about 750 to about 1500 nm, more preferably 750 to 1100 nm, such as a semiconductor laser diode, a Nd:YAG or a Nd:YLF laser. The required laser power depends on the sensitivity of the plate precursor, the pixel dwell time of the laser beam, which is determined by the spot diameter (typical value of modern plate-setters at $1/e^2$ of maximum intensity: 5-25 µm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) platesetters. ITD plate-setters for thermal plates are typically characterized by a very high scan speed up to 500 m/sec and may require a laser power of several Watts. XTD platesetters for thermal plates having a typical laser power from about 200 mW to about 1 W operate at a lower scan speed, e.g. from 0.1 to 10 m/sec. An XTD platesetter equipped with one or more laserdiodes emitting in the wavelength range between 750 and 850 nm is an especially preferred embodiment for the method of the present invention.

The known platesetters can be used as an off-press exposure apparatus, which offers the benefit of reduced press down-time. XTD platesetter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

Preferred lithographic printing plate precursors according to the present invention produce a useful lithographic image upon image-wise exposure with IR-light having an energy density, measured at the surface of said precursor, of 200 mJ/cm$^2$ or less, more preferably of 180 mJ/cm$^2$ or less, most preferably of 160 mJ/cm$^2$% less. With a useful lithographic image on the printing plate, 2% dots (at 200 lpi) are perfectly visible on at least 1000 prints on paper.

The printing plate precursor, after exposure, is developed off-press by means of a suitable processing liquid. In the development step, the exposed areas of the image-recording layer are at least partially removed without essentially removing the non-exposed areas, i.e. without affecting the exposed areas to an extent that renders the ink-acceptance of the exposed areas unacceptable. The processing liquid can be applied to the plate e.g. by rubbing with an impregnated pad, by dipping, immersing, (spin-)coating, spraying, pouring-on, either by hand or in an automatic processing apparatus. The treatment with a processing liquid may be combined with mechanical rubbing, e.g. by a rotating brush. The developed plate precursor can, if required, be post-treated with rinse water, a suitable correcting agent or preservative as known in the art. During the development step, any water-soluble protective layer present is preferably also removed. The development is preferably carried out at temperatures of from 20 to 40° C. in automated processing units as customary in the art. More details concerning the development step can be found in for example EP 1 614 538, EP 1 614 539, EP 1 614 540 and WO/2004/071767.

The developing solution preferably contains a buffer such as for example a silicate-based buffer or a phosphate buffer. The concentration of the buffer in the developer preferably ranges between 3 to 14% wt. Silicate-based developers which have a ratio of silicon dioxide to alkali metal oxide of at least 1 are advantageous because they ensure that the alumina layer (if present) of the substrate is not damaged. Preferred alkali metal oxides include Na$_2$O and K$_2$O, and mixtures thereof. A particularly preferred silicate-based developer solution is a developer solution comprising sodium or potassium metasilicate, i.e. a silicate where the ratio of silicon dioxide to alkali metal oxide is 1.

The developing solution may optionally contain further components as known in the art: other buffer substances, chelating agents, surfactants, complexes, inorganic salts, inorganic alkaline agents, organic alkaline agents, antifoaming agents, organic solvents in small amounts i.e. preferably less than 10% wt and more preferably less than 5% wt, non-reducing sugars, glycosides, dyes and/or hydrotropic agents. These components may be used alone or in combination.

To ensure a stable processing with the developer solution for a prolonged time, it is particularly important to control the concentration of the ingredients in the developer. Therefore a replenishing solution, hereinafter also referred to as replenisher, is often added to the developing solution. More than one replenishing solution containing different ingredients and/or different amounts of the ingredients may be added to the developing solution. Alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. It is advantageous that the (co)polymer of the present invention is present in the replenisher(s); preferably at a concentration of at least 0.5 g/l, more preferably in a concentration ranging between 1 and 50 g/l most preferably between 2 and 30 g/l.

The replenishing solution has preferably a pH value of at least 10, more preferably of at least 11, most preferably of at least 12.

The development step may be followed by a rinsing step and/or a gumming step. A suitable gum solution which can be used is described in for example EP-A 1 342 568 and WO 2005/111727.

To increase the resistance of the finished printing plate and hence to extend its press-life capability (run length), the plate coating is preferably briefly heated to elevated temperatures ("baking"). The plate can be dried before baking or is dried during the baking process itself. During the baking step, the plate can be heated at a temperature which is higher than the glass transition temperature of the heat-sensitive coating, e.g. between 100° C. and 300° C. for a period of 15 seconds to 5 minutes. In a preferred embodiment, the baking temperature does not exceed 300° C. during the baking period. Baking can be done in conventional hot air ovens or by irradiation with lamps emitting in the infrared or ultraviolet spectrum, as e.g. described in EP 1 588 220 and EP 1 916 101. Both so-called static and dynamic baking ovens can be used. As a result of this baking step, the resistance of the printing plate to plate cleaners, correction agents and UV-curable printing inks increases. Such a thermal post-treatment is known in the art and is described, inter alia, in DE 1 447 963, GB 1 154 749 and EP 1 506 854.

According to the present invention there is also provided a method for making a positive-working lithographic printing plate comprising the steps of imagewise exposing the heat-sensitive lithographic printing plate precursor according to the present invention to heat and/or infrared light, followed by developing the imagewise exposed precursor with an aqueous alkaline developer so that the exposed areas are dissolved. The obtained precursor may optionally be baked.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. No. 4,045,232; U.S. Pat. No. 4,981,517 and U.S. Pat. No. 6,140,392. In a most preferred embodiment, the single-fluid ink comprises an ink phase, also called the hydrophobic or oleophilic phase, and a polyol phase as described in WO 00/32705.

EXAMPLES

1. Synthesis of the Binders According to the Present Invention

1) Sulfonamide Monomers.

The sulfonamide monomers can be prepared as disclosed in WO 07/099,047 (Agfa Graphics N.V.) and described by Volker et al., Makromoleculare Chemie, 177(6), 1791-1813 (1976).

2) Monomers Comprising the Salicylic Acid Group 2.1. The synthesis of 2-hydroxy-4-{3-[2-(2-methyl-acryloyloxy)-ethyl]-ureido}-benzoic acid

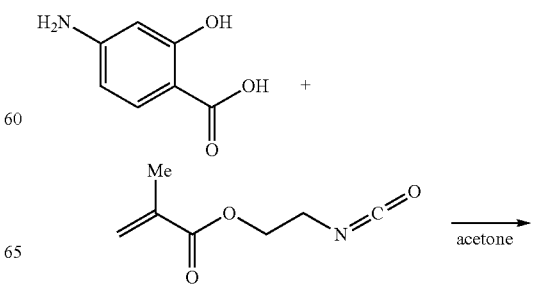

-continued

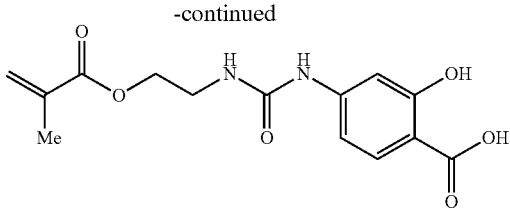

15.3 g (0.1 mol) 4-amino-2-hydroxy-benzoic acid was dissolved in 100 ml acetone. 17.06 g (0.11 mol) 2-isocyanatoethyl methacrylate was dissolved in 15 ml acetone and added dropwise to the 4-amino-2-hydroxy-benzoic acid solution. The temperature rose to 32° C. during the addition. The reaction was allowed to continue for two hours at room temperature. The solvent was evaporated under reduced pressure. The residue was dissolved in a mixture 200 ml acetone and 50 ml methanol. The solution was added to 1 l water while stirring. 2-hydroxy-4-{3-[2-(2-methyl-acryloyloxy)-ethyl]-ureido}-benzoic acid precipitated from the medium and was isolated by filtration. 2-hydroxy-4-{3-[2-(2-methyl-acryloyloxy)-ethyl]-ureido}-benzoic acid was washed twice with 150 ml water and dried. 28.5 g (92.5%) of 2-hydroxy-4-{3-[2-(2-methyl-acryloyloxy)-ethyl]-ureido}-benzoic acid was isolated (melting point: 208-210° C.)

2.2 The synthesis of 2-hydroxy-4-(2-methyl-acryloylamino)-benzoic acid

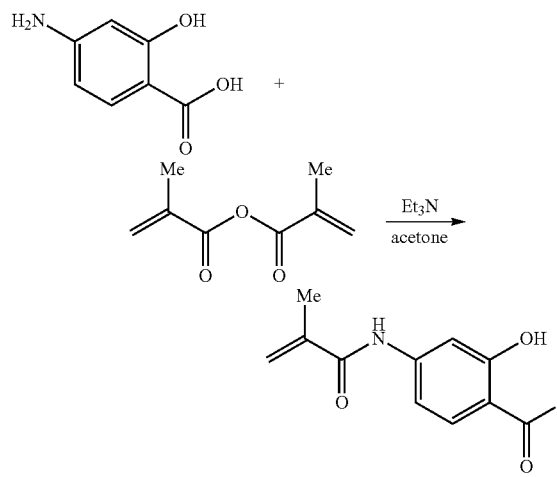

382.85 g (2.5 mol) of 4-amino-2-hydroxy-benzoic acid was dissolved in 2.5 l acetone. 424 g (2.75 mol) methacryloyl anhydride was added and the reaction mixture was cooled to 0° C. 277.75 g (2.75 mol) triethyl amine was dissolved in 500 ml acetone and added to the reaction mixture over 30 minutes. The reaction was allowed to continue at room temperature for 20 hours. The solvent was removed under reduced pressure. The residue was re-dissolved in 2.5 l methylene chloride and the mixture was extracted with 500 ml of a 3 N hydrochloric acid solution. Upon extraction, 2-hydroxy-4-(2-methyl-acryloylamino)-benzoic acid partially crystallized from the medium and was isolated by filtration. The methylene chloride was extracted a second time with 500 ml of a 3 N hydrochloric acid solution. A second fraction of 2-hydroxy-4-(2-methyl-acryloylamino)-benzoic acid was isolated by filtration. The two fractions were pooled and treated in 2.5 l acetone at reflux. The mixture was poured into 5 l water. 2-hydroxy-4-(2-methyl-acryloylamino)-benzoic acid precipitated from the medium, was isolated by filtration, washed with water and dried. 400 g (72%) 2-hydroxy-4-(2-methyl-acryloylamino)-benzoic acid was isolated (melting point: 220-222° C.)

2.3. The synthesis of 2-hydroxy-5-(2-methyl-acryloylamino)-benzoic acid

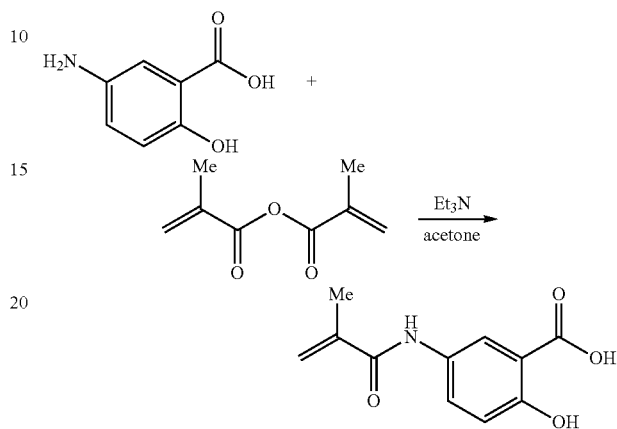

15.3 g (0.1 mol) 5-amino-2-hydroxy-benzoic acid was added to 100 ml acetone. 11.11 g (0.11 mol) triethyl amine was dissolved in 20 ml acetone and added to the mixture. 16.95 g (0.11 mol) methacryloyl anhydride was added over 10 minutes and the reaction was allowed to continue for one hour at room temperature. The solvent was removed under reduced pressure and the residue was re-dissolved in 150 ml methanol. The solution was added to 250 ml 3N HCl. The crude 2-hydroxy-5-(2-methyl-acryloylamino)-benzoic acid was isolated by filtration, re-dissolved in 200 ml methanol and precipitated in 500 ml water. 2-hydroxy-5-(2-methyl-acryloylamino)-benzoic acid was isolated by filtration and further purified by preparative column chromatography on a Prochrom LC80™ colum, packed with Kromasil™ C18 100A 10 μm, using methanol/0.2 M ammonium acetate 40/60 as eluent. 4.83 g (21.8%) of 2-hydroxy-5-(2-methyl-acryloylamino)-benzoic acid was isolated (TLC:$R_f$: 0.5, eluent methanol/1 M NaCl 40/60 on Whatman Partisil™ KC18F; melting point: 218° C.)

3) Synthesis of the Comparative and Inventive Polymers

The Comparative polymers 1 and 2 and Inventive polymers 3 to 8 were prepared according to the following procedure.

In a 250 ml reactor, the amount of each type of monomers as indicated in Table 1 below were added to 35.4 g gamma-butyrolactone and the mixture was heated to 140° C., while stirring at 200 rpm. Upon complete dissolution of the monomer mixture, the reaction mixture was allowed to cool down to the initiation temperature as indicated in Table 1. 80 μl of Trigonox™ DC50 (commercially available from AKZO NOBEL) was added at once, immediately followed by the addition of 1.121 ml of a 25% solution of Trigonox™ 141 (commercially available from AKZO NOBEL) in gamma-butyrolactone. After 4 minutes, 410 μl of Trigonox™ DC50 was added over two hours while the reaction mixture was heated to 140° C. The polymerization was allowed to continue for two hours at 140° C. The reaction mixture was allowed to cool down to 120° C. and 19.6 ml 1-methoxy-2-propanol was added. The reaction mixture was allowed to cool down to room temperature. The reaction mixture was used directly for the preparation of the coating solutions without further purification. The obtained polymers are given in Table 3 below.

The presence of residual monomer in each of the samples was analyzed, using thin layer chromatography in comparison with original samples of the different monomers. Partisil KC18F Plates™, supplied by Whatman were used. MeOH/ 0.5 M NaCl 60/40 was used as eluent. In none of the samples, residual monomer could be detected.

TABLE 1

Amount of monomers.

| Polymer T(ini)* | Monomer 1 | Monomer 2 | Monomer 3 |
|---|---|---|---|
| Comp. Polymer-01 96° C. | 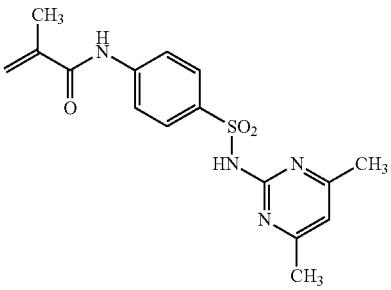 [SMILES: C=C(C)C(=O)Nc1ccc(S(=O)(=O)Nc2nc(C)cc(C)n2)cc1] 15.8 | — | 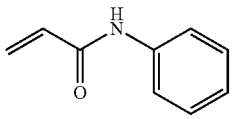 3.6 |
| Comp. Polymer-02 96° C. | 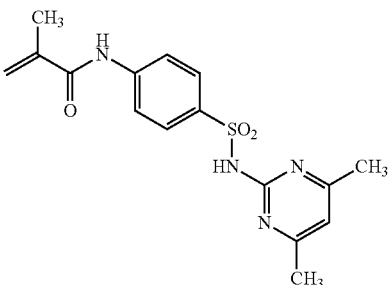 11.6 | — | 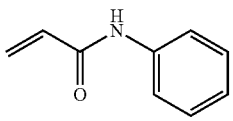 5.3 |
| Inv. Pol. 3 100° C. | 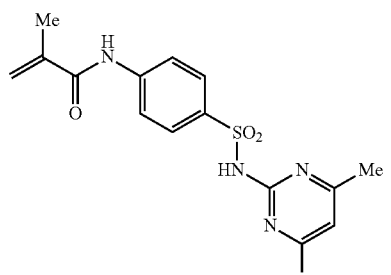 12.1 g | 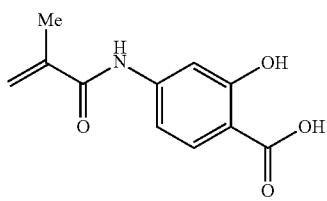 [SMILES: C=C(C)C(=O)Nc1ccc(C(=O)O)c(O)c1] 0.77 g | 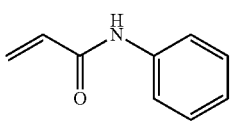 4.6 g |
| Inv. Pol. 4 105° C. | 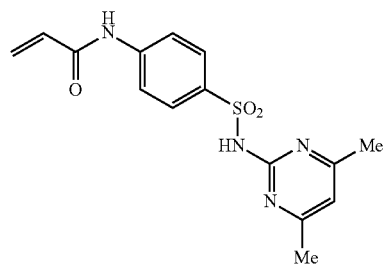 [SMILES: C=CC(=O)Nc1ccc(S(=O)(=O)Nc2nc(C)cc(C)n2)cc1] 11.6 g | 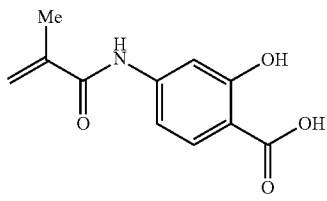 [SMILES: C=C(C)C(=O)Nc1ccc(C(=O)O)c(O)c1] 0.77 g | 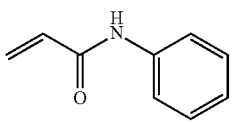 4.6 g |

TABLE 1-continued

Amount of monomers.

| Polymer T(ini)* | Monomer 1 | Monomer 2 | Monomer 3 |
|---|---|---|---|
| Inv. Pol. 5 105° C. | [N-(4-(pyridin-3-ylsulfamoyl)phenyl)methacrylamide] 11.1 g | [4-methacrylamido-2-hydroxybenzoic acid] 0.77 g | [N-phenylacrylamide] 4.6 g |
| Inv. Pol. 6 105° C. | [N-(4-sulfamoylphenyl)methacrylamide] 8.4 g | [4-methacrylamido-2-hydroxybenzoic acid] 0.77 g | [N-phenylacrylamide] 4.6 g |
| Inv. Pol. 7 105° C. | [N-(4-(4,6-dimethylpyrimidin-2-ylsulfamoyl)phenyl)methacrylamide] 12.1 g | [2-(3-(4-carboxy-3-hydroxyphenyl)ureido)ethyl methacrylate] 1.1 g | [N-phenylacrylamide] 4.6 g |
| Inv. Pol. 8 105° C. | [N-(4-(4,6-dimethylpyrimidin-2-ylsulfamoyl)phenyl)methacrylamide] 12.1 g | [5-methacrylamido-2-hydroxybenzoic acid] 1.1 g | [N-phenylacrylamide] 4.6 g |

*initiation temperature

The molecular weight of these polymers ($M_n$, $M_w$, $M_n/M_w$) was analyzed with size exclusion chromatography, using dimethyl acetamide/0.21% LiCl as eluent on a 3× mixed-B column and relative to polystyrene standards. The analytical results are given below in Table 2.

TABLE 2 molecular weight of the Inventive Polymers.

|  | $M_n$ | $M_w$ | $M_w/M_n$ |
|---|---|---|---|
| Comp. Polymer 1 | 52718 | 140110 | 2.7 |
| Comp. Polymer 2 | 47000 | 135500 | 2.9 |

TABLE 2-continued molecular weight of the Inventive Polymers.

|  | $M_n$ | $M_w$ | $M_w/M_n$ |
|---|---|---|---|
| Inv. Polymer 3 | 45000 | 121000 | 2.7 |
| Inv. Polymer 4 | 65000 | 380000 | 5.9 |
| Inv. Polymer 5 | 32000 | 60000 | 1.8 |
| Inv. Polymer 6 | 43000 | 119000 | 2.8 |
| Inv. Polymer 7 | 42000 | 147000 | 3.5 |
| Inv. Polymer 8 | 41000 | 162000 | 3.9 |

TABLE 3

Monomer composition of the polymers.

| | Monomer 1 | Monomer 2 | Monomer 3 |
|---|---|---|---|
| Comp. polymer 1 | 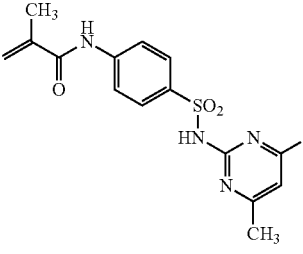 65 mol % | 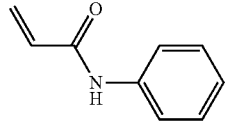 35 mol % | — |
| Comp. polymer 2 | 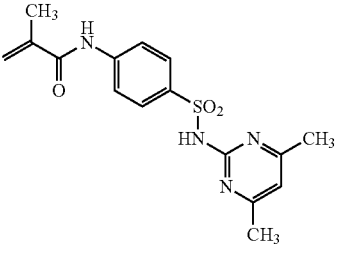 [SMILES: C=C(C)C(=O)Nc1ccc(S(=O)(=O)Nc2nc(C)cc(C)n2)cc1] 48 mol % | 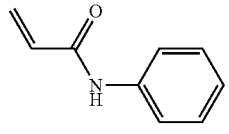 52 mol % | — |
| Inv. Polymer 3 | 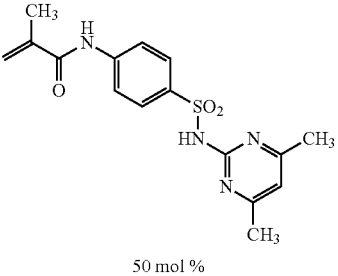 50 mol % | 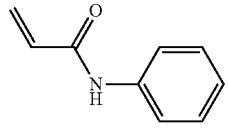 45 mol % | 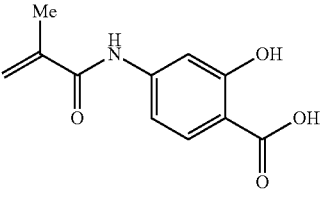 [SMILES: C=C(C)C(=O)Nc1ccc(C(=O)O)c(O)c1] 5 mol % |
| Inv. Polymer 4 | 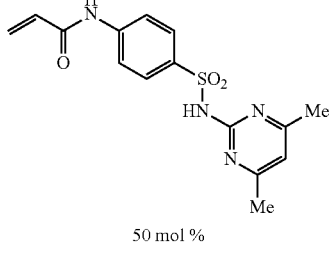 50 mol % | 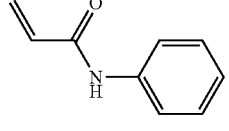 45 mol % | 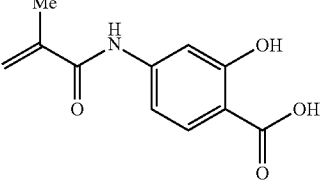 5 mol % |

TABLE 3-continued

Monomer composition of the polymers.

| | Monomer 1 | Monomer 2 | Monomer 3 |
|---|---|---|---|
| Inv. Polymer 5 | [structure] 50 mol % | [structure] 45 mol % | [structure] 5 mol % |
| Inv. Polymer 6 | [structure] 50 mol % | [structure] 45 mol % | [structure] 5 mol % |
| Inv. Polymer 7 | [structure] 50 mol % | [structure] 45 mol % | [structure] 5 mol % |
| Inv. Polymer 8 | [structure] 50 mol % | [structure] 45 mol % | [structure] 5 mol % |

2. Synthesis of Oxonol

The triethyl amine salt of the oxonol dye 5-[5-(1,3-dimethyl-2,4,6-trioxo-1,3-diazinan-5-ylidene)penta-1,3-dien-1-yl]-1,3-dimethyl-1,3-diazinane-2,4,6-trione was prepared as described below and used as triethyl amine salt in the coating formulations.

The reaction scheme:

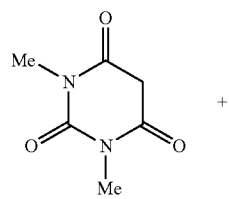

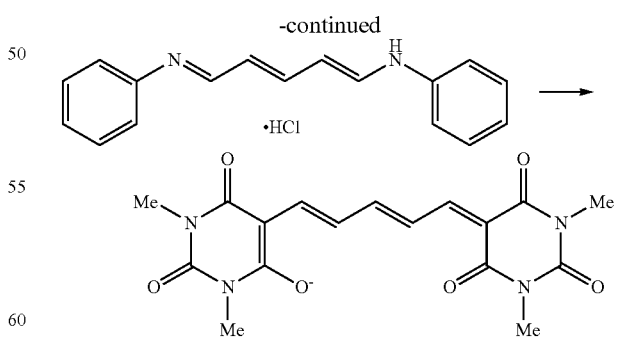

142.4 g (0.5 mol) glutaconic aldehyde dianil hydrochloride (TCI Europe) and 161 g (1.03 mol) 1,3-dimethyl-barbituric acid were dissolved in 1 l acetone at room temperature. 150 g (205 ml, 1.48 mol) triethyl amine was added dropwise over 20 minutes. The temperature rose to 40° C. The reaction was allowed to continue or 2 hours at 35° C. 0.5 l ethyl acetate was added and the mixture was stirred for an additional hour. The crude oxonol dye was isolated by filtration and washed with 1 l ethyl acetate. The crude oxonol dye was redispersed in a mixture of 1 l ethyl acetate and 0.5 l methanol containing 10 g triethyl amine. The mixture was stirred for 16 hours at room temperature. The oxonol dye was isolated by filtration washed with 0.5 l ethyl acetate/methanol (3/1) followed by washing with 1 l ethyl acetate and 0.5 l methyl-tert.butyl-ether and dried. 195 g (82%) of the oxonol dye was isolated.

3. Preparation of the Lithographic Supports

Preparation of the Lithographic Support S-00

A 0.3 mm thick aluminium foil was degreased by spraying with an aqueous solution containing 34 g/l NaOH at 70° C. for 6 seconds and rinsed with demineralised water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/dm$^2$ (charge density of about 80° C./dm$^2$). Afterwards, the aluminium foil was desmutted by etching with an aqueous solution containing 145 g/l of sulfuric acid at 80° C. for 5 seconds and rinsed with demineralised water for 4 seconds. The foil was subsequently subjected to anodic oxidation during 10 seconds in an aqueous solution containing 145 g/l of sulfuric acid at a temperature of 57° C. and a current density of 33 A/dm$^2$ (charge density of 330 C/dm$^2$), then washed with demineralised water for 7 seconds and dried at 120° C. for 7 seconds.

The support thus obtained was called support S-00.
Preparation of the Lithographic Support S-01

The lithographic support S-01 was produced by spraying, onto the above described support S-00, a post treatment solution containing 2.2 g/l polyvinylphosphonic acid (PVPA) for 4 seconds at 70° C., rinsed with demineralised water for 3.5 seconds and dried at 120° C. for 7 seconds.
Preparation of the Lithographic Support S-02

The lithographic support S-02 was produced by dipping the described support S-00 in a solution containing 25 g/l of sodium silicate for 10 seconds at 70° C. The support was then rinsed with demineralised water for 10 seconds and dried at room temperature.

4. Preparation of the Printing Plate Precursors

Preparation of the Printing Plate Precursors PPP-01 to PPP-10

The printing plate precursors PPP-01 to PPP-10 were produced by first applying onto the above described supports the coating solution containing the ingredients as defined in Table 4 dissolved in a mixture of the following solvents: 57% by volume of tetrahydrofuran, 33% by volume of Dowanol PM (1-methoxy-2-propanol, commercially available from DOW CHEMICAL Company) and 10% by volume of gamma-butyrolactone. The coating solution was applied at a wet coating thickness of 20 μm and then dried at 135° C. for 3 minutes.

TABLE 4 composition of the first coating.

| PPP | Support | polymer (1) g/m$^2$ | Oxonol dye (2) g/m$^2$ | Tegoglide 410 (3) g/m$^2$ |
|---|---|---|---|---|
| PPP-01, comp. | S-02 | Comp. Polymer 1 0.650 | 0.020 | 0.001 |
| PPP-02, comp. | S-02 | Comp. Polymer 2 0.650 | 0.020 | 0.001 |
| PPP-03, inv. | S-02 | Inv. Polymer 3 0.650 | 0.020 | 0.001 |
| PPP-04, inv. | S-02 | Inv. Polymer 4 0.650 | 0.020 | 0.001 |
| PPP-05, inv. | S-02 | Inv. Polymer 5 0.650 | 0.020 | 0.001 |
| PPP-06, inv. | S-02 | Inv. Polymer 6 0.650 | 0.020 | 0.001 |
| PPP-07, inv. | S-02 | Inv. Polymer 7 0.650 | 0.020 | 0.001 |
| PPP-08, inv. | S-02 | Inv. Polymer 8 0.650 | 0.020 | 0.001 |
| PPP-09, comp. | S-01 | Comp. Polymer 1 0.650 | 0.020 | 0.001 |
| PPP-10, inv. | S-01 | Inv. Polymer 5 0.650 | 0.020 | 0.001 |

(1) See Table 3 above;
(2) Oxonol dye: 5-[5-(1,3-dimethyl-2,4,6-trioxo-1,3-diazinan-5-ylidene)penta-1,3-dien-1-yl]-1,3-dimethyl-1,3-diazinane-2,4,6-trione; triethylamine, synthesized as described above (see no. 2 above);
(3) TEGOGLIDE 410 is a copolymer of polysiloxane and poly(alkylene oxide), commercially available from TEGO CHEMIE SERVICE GmbH.

Subsequently, a second coating solution containing the ingredients as defined in Table 5, dissolved in a mixture of the following solvents: 50% by volume of MEK, 50% by volume of Dowanol PM™, which is 1-methoxy-2-propanol, commercially available from DOW CHEMICAL Company, was applied onto the coated support. The second coating solution was applied at a wet coating thickness of 16 μm and then dried at 125° C. for 3 minutes.

TABLE 5 composition of the second coating.

| INGREDIENTS | Second coating g/m$^2$ |
|---|---|
| Alnovol SPN402 (1) | 0.668 |
| SOO94 (2) | 0.025 |
| Crystal Violet (3) | 0.010 |
| Tegoglide 410 (4) | 0.001 |
| TMCA (5) | 0.056 |

(1) Alnovol SPN402 is a 44.0 wt. % solution in Dowanol PM of a m,p-cresol-cresol-xylenol formaldehyde novolac resin commercially available from Clariant GmbH;
(2) SOO94 is an IR absorbing cyanine dye, commercially available from FEW CHEMICALS; the chemical structure of SOO94 is:

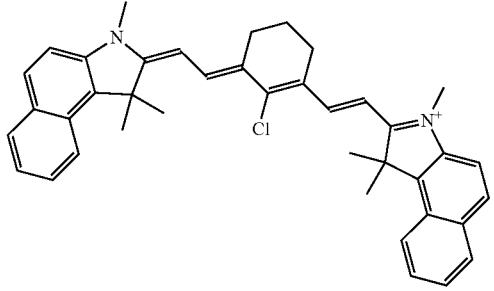 [SMILES: CN1/C(=C/C=C2\CCCC(/C=C/C3=[N+](C)c4ccc5ccccc5c4C3(C)C)=C2Cl)C(C)(C)c2c1ccc1ccccc21]

TABLE 5-continued composition of the second coating.

| INGREDIENTS | Second coating g/m² |
|---|---|

(3) Crystal Violet, commercially available from CIBA-GEIGY;
(4) TEGOGLIDE 410 is a copolymer of polysiloxane and poly(alkylene oxide), commercially available from TEGO CHEMIE SERVICE GmbH;
(5) TMCA is 3,4,5-trimethoxy cinnamic acid:

Imaging and Processing.

The obtained printing plate precursors PPP-01 to PPP-10 were exposed with a Creo Trendsetter 3244 (external drum platesetter available from Kodak), having a 20 W thermal head, operating at 140 rpm. The imaging resolution amounted to 2400 dpi. Each printing plate precursor was exposed to several energy densities (exposure series).

Subsequently, the exposed printing plate precursor were processed in an Elantrix™ 85H processor (processing apparatus commercially available from Agfa Graphics N.V.). The developer section was filled with Energy Elite™ Improved Developer (commercially available from Agfa Graphics N.V.) and the gum/finisher section with RC795c™-50% diluted in water (commercially available from Agfa Graphics N.V.). The developer temperature was 22° C., the developer dwell time amounted to 25s.

5. Clean-Out Efficiency

The clean-out efficiency is defined as the energy density at which the non-image parts have an optical density which is less than or equal to 0.100 (measured with a GretagMacbeth D19C densitometer, black filter setting, commercially available from GretagMacbeth AG).

The results for the clean-out efficiency obtained for the plate precursors PPP-01 to PPP-08 including support S02 (silicate post-treated support) are given in Table 6.

TABLE 6

Clean-out efficiency results.

| Printing Plate Precursor | Support | Clean-out efficiency (mJ/cm²) |
|---|---|---|
| PPP-01, comp. | S-02 | >150 |
| PPP-02, comp. | S-02 | >150 |
| PPP-03, inv. | S-02 | 65 |
| PPP-04, inv. | S-02 | 85 |
| PPP-05, inv. | S-02 | 70 |
| PPP-06, inv. | S-02 | 65 |
| PPP-07, inv. | S-02 | 60 |
| PPP-08, inv. | S-02 | 60 |

The results in Table 6 demonstrate that the printing plate precursors PPP-01 and PPP-02 comprising a comparative polymer show an unacceptable clean-out behaviour while the printing plate precursors PPP-03 to PPP-08 comprising a polymer according to the present invention exhibit an improved clean-out efficiency.

The results for the clean-out efficiency obtained for the plate precursors PPP-09 and PPP-10 including support S-01 (PVPA post-treated support) are given in Table 7.

TABLE 7

Clean-out efficiency results.

| Printing Plate Precursor | Support | Clean-out efficiency (mJ/cm²) |
|---|---|---|
| PPP-09, comp. | S-01 | 60 |
| PPP-10, inv. | S-01 | 65 |

The results in Table 7 demonstrate that the printing plate precursor PPP-09 comprising a comparative polymer and the printing plate precursor PPP-10 comprising a polymer according to the present invention both show a good clean-out behaviour.

6. Sensitivity

The sensitivity is defined as the energy density at which the 1×1 pixel checkerboard pattern has a 52% dot area coverage and at which the non-image parts have an optical density which is less than or equal to 0.100 (as measured with a GretagMacbeth™ D19C densitometer, black filter setting, commercially available from GretagMacbeth AG). The results for the sensitivity are given in Table 8.

TABLE 8 sensitivity results.

| Printing Plate Precursor | Support | Sensitivity mJ/cm² |
|---|---|---|
| PPP-01, comp. | S-02 | Clean-out problem |
| PPP-03, inv. | S-02 | 156 |
| PPP-05, inv. | S-02 | 162 |
| PPP-07, inv. | S-02 | 173 |
| PPP-08, inv. | S-02 | 175 |
| PPP-09, comp. | S-01 | 149 |
| PPP-10, inv. | S-01 | 174 |

The results in Table 8 show that all the printing plate precursors exhibit a good sensitivity: i.e. the printing plate precursors produce a useful lithographic image upon imagewise exposure with IR-light having an energy density measured at the surface of the precursor of 180 mJ/cm² or less. A useful lithographic image is defined as an image on the printing plate where 2% dots (at 200 lpi) are perfectly visible on at least 1000 prints on paper.

7. Press Life

The printing plate precursors PPP-01, PP-03, PP-05, PP-07, PP-08, PP-09 and PPP-10 were exposed with a Creo Trendsetter 3244 (external drum platesetter available from Kodak), having a 20 W thermal head, operating at 140 rpm. The imaging resolution amounted to 2400 dpi. Each printing plate precursor was exposed using the sensitivity values described in Table 8.

Subsequently, the exposed printing plate precursor were processed in an Elantrix™ 85H processor (processing apparatus commercially available from Agfa Graphics N.V.). The developer section was filled with Energy Elite™ Improved Developer (commercially available from Agfa Graphics N.V.) and the gum/finisher section with RC795c™-50% diluted in water (commercially available from Agfa Graphics N.V.). The developer temperature was 22° C., the developer dwell time amounted to 25s.

Subsequently, the resulting printing plates were cut to the correct size to allow them to be mounted side-by-side on a Ryobi 522 HXX™ sheetfet press equipped with a UV dryer. Subsequently UV printing was performed on offset amber 70 g/m² paper (commercially available from Artic paper) using Jänecke & Schneemann Supra UV Magenta GA 568 011 as ink (commercially available from Jänecke & Schneemann) and 3% Prima FS404AS (commercially available from Agfa Graphics N.V.)+5% isopropyl alcohol as fountain solution.

The press life of each printing plate was evaluated by monitoring every 5.000 impressions the rendition (density) on the printed sheet of a test pattern with a nominal tone value of 40% (200 lpi ABS (Agfa Balanced Screening)) using a Gretag-MacBeth D19C (commercially available from GretagMacbeth AG, magenta filter setting). The press life of each printing plate is defined as the point where the density of the 40% test pattern drops with 4% (absolutely). The result of the press life test is a measure of the press life of the plate. Results are given in Table 9.

TABLE 9 press life results.

| Printing Plate Precursor | Support | Press life |
| --- | --- | --- |
| PP-01, comp. | S-02 | Clean-out problem |
| PP-03, inv. | S-02 | 85 000 |
| PP-05, inv. | S-02 | 85 000 |
| PP-07, inv. | S-02 | 90 000 |
| PP-08, inv. | S-02 | 85 000 |
| PP-09, comp. | S-01 | 70 000 |
| PP-10, inv. | S-01 | 70 000 |

Excellent press life results were obtained for the printing plates PP-03, PP-05, PP-07 and PP-08 according to the invention, i.e. the printing plates comprising a polymer with a salicylic acid functionality, and good press life results were obtained for PP-09 and PP-10.

The invention claimed is:

1. A positive-working lithographic printing plate precursor which comprises on a support having a hydrophilic surface or which is provided with a hydrophilic layer, a heat and/or light-sensitive coating including a first layer comprising an infrared absorbing agent and a binder including a monomeric unit including a salicylic acid group and a monomeric unit including a sulfonamide group, wherein the monomeric unit including a salicylic acid group is represented by:

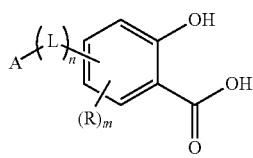

wherein
A represents a structural moiety comprising at least one polymerizable ethylenically unsaturated group; wherein the structural moiety comprising at least one polymerizable ethylenically unsaturated group is represented by

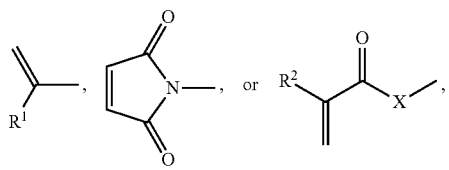

wherein
$R^1$ represents hydrogen, an alkyl group or —COOR³ wherein $R^3$ represents an alkyl group; and
$R^2$ represents hydrogen or an alkyl group and X represents —O— or —NR⁴ wherein $R^4$ represents hydrogen or an alkyl group;
L represents a divalent linking group;
n represents 0 or 1;
m represents an integer from 0 to 3; and
R represents a halogen, an optionally substituted alkyl, alkenyl, alkynyl, aralkyl, alkaryl, aryl, heteroaryl, ether, hydroxyl, ester, amine, amide, thioether, sulfoxide, sulfone, thiol, nitro, nitrile, carboxylic acid or sulfonamide group, or two R-groups represent the necessary atoms to form a five to eight membered ring.

2. A printing plate precursor according to claim 1, wherein the binder comprises 2 mol % to 15 mol % of the monomeric unit including a salicylic acid group.

3. A printing plate precursor according to claim 1, wherein the first layer comprises a dye according to the structure:

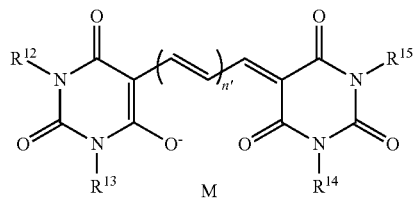

wherein
$R^{12}$ to $R^{15}$ independently represent an optionally substituted alkyl, alkenyl, alkynyl, aryl or heteroaryl group;
n' represents 1 or 2; and
M represents a cationic group.

4. A printing plate precursor according to claim 1, wherein the monomeric unit including a sulfonamide group is represented by —NR^j—SO₂—, —SO₂—NR^k— wherein $R^j$ and $R^k$ each independently represent hydrogen, an optionally substituted alkyl, alkanoyl, alkenyl, alkynyl, alkaryl, cycloalkyl, heterocyclic, aryl, heteroaryl, aralkyl or heteroaralkyl group, or combinations thereof.

5. A printing plate precursor according to claim 4, wherein the monomeric unit including a sulfonamide group is derived from the monomer according to the formula:

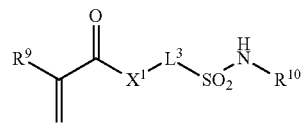

wherein
$R^9$ represents hydrogen or an alkyl group;
$X^1$ represents —O— or —NR^{11}— wherein $R^{11}$ represents hydrogen, an optionally substituted alkyl, alkenyl, alkynyl, aralkyl, alkaryl, aryl or heteroaryl group;

L³ represents an optionally substituted alkylene, arylene, hetero-arylene, aralkylene, alkarylene group, —O—(CH₂)ₖ′—, —(CH₂)ₗ′—O—, or combinations thereof, wherein k' and l' independently represent an integer greater than 0; and R¹⁰ represents hydrogen, an optionally substituted alkyl, cycloalkyl, alkenyl, alkynyl, aralkyl, alkaryl, aryl, heteroaryl or acyl group.

6. A printing plate precursor according to claim 1, wherein the binder comprises 35 mol % to 75 mol % of the monomeric unit including a sulfonamide group.

7. A printing plate precursor according to claim 1, wherein the coating comprises a second layer including a phenolic resin, said second layer being located above the first layer comprising the binder including a monomeric unit including a salicylic acid group and a monomeric unit including a sulfonamide group.

8. A printing plate precursor according to claim 1, wherein the binder is present in the first layer in an amount comprised between 15% wt and 85% wt.

9. A method for making a positive-working lithographic printing plate precursor comprising the steps of
providing a support;
applying on said support a heat and/or light-sensitive coating as defined in claim 1; and
drying the coating.

10. A method for making a positive-working lithographic printing plate comprising the steps of:
imagewise exposing a heat-sensitive lithographic printing plate precursor as defined in claim 1 to heat and/or infrared light;
developing said imagewise exposed precursor with an aqueous alkaline developer so that the exposed areas are dissolved; and
optionally baking the obtained plate.

11. A method of printing comprising the steps of:
a) providing a printing plate according to claim 1;
b) mounting the printing plate on a printing press;
c) supplying ink and fountain solution to the printing plate; and
d) transferring the ink to paper.

12. A positive-working lithographic printing plate precursor which comprises on a support having a hydrophilic surface or which is provided with a hydrophilic layer, a heat and/or light-sensitive coating including a first layer comprising an infrared absorbing agent and a binder including a monomeric unit including a salicylic acid group and a monomeric unit including a sulfonamide group,
wherein the monomeric unit including a salicylic acid group is represented by:

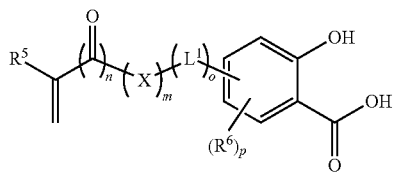

wherein:
R⁵ represents hydrogen, an alkyl or —COOR⁷ wherein R⁷ represents an alkyl group;
X represents —O—, —NR⁸— or —S— and wherein R⁸ represents hydrogen or an alkyl group;
L¹ represent a divalent linking group;

R⁶ represents a halogen, an optionally substituted alkyl, alkenyl, alkynyl, aralkyl, alkaryl, aryl, heteroaryl, ether, hydroxyl, ester, amine, amide, thioether, sulfoxide, sulfone, thiol, nitro, nitrile, carboxylic acid or sulfonamide group, or two R⁶-groups represent the necessary atoms to form a five to eight membered ring;
m, n and o independently represent 0 or 1; and
p represents an integer from 0 to 3.

13. A printing plate precursor according to claim 12, wherein the binder comprises 2 mol % to 15 mol % of the monomeric unit including a salicylic acid group.

14. A printing plate precursor according to claim 12, wherein the binder comprises 35 mol % to 75 mol % of the monomeric unit including a sulfonamide group.

15. A printing plate precursor according to claim 12, wherein the binder further comprises a monomeric unit selected from an acrylate, a methacrylate, an acrylamide, a methacrylamide and a maleimide.

16. A printing plate precursor according to claim 12, wherein the coating comprises a second layer including a phenolic resin, said second layer being located above the first layer comprising the binder including a monomeric unit including a salicylic acid group and a monomeric unit including a sulfonamide group.

17. A printing plate precursor according to claim 12, wherein the monomeric unit including a sulfonamide group is represented by —NRʲ—SO₂—, —SO₂—NRᵏ— wherein Rʲ and Rᵏ each independently represent hydrogen, an optionally substituted alkyl, alkanoyl, alkenyl, alkynyl, alkaryl, cycloalkyl, heterocyclic, aryl, heteroaryl, aralkyl or heteroaralkyl group, or combinations thereof.

18. A positive-working lithographic printing plate precursor which comprises on a support having a hydrophilic surface or which is provided with a hydrophilic layer, a heat and/or light-sensitive coating including a first layer comprising an infrared absorbing agent and a binder including a monomeric unit including a salicylic acid group and a monomeric unit including a sulfonamide group, wherein the monomeric unit including a salicylic acid group is represented by:

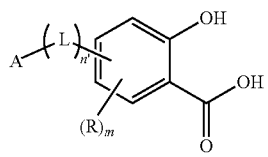

wherein
A represents a structural moiety comprising at least one polymerizable ethylenically unsaturated group;
L represents a divalent linking group;
n represents 0 or 1;
m represents an integer from 0 to 3;
R represents a halogen, an optionally substituted alkyl, alkenyl, alkynyl, aralkyl, alkaryl, aryl, heteroaryl, ether, hydroxyl, ester, amine, amide, thioether, sulfoxide, sulfone, thiol, nitro, nitrile, carboxylic acid or sulfonamide group, or two R-groups represent the necessary atoms to form a five to eight membered ring;
wherein the binder further comprises a monomeric unit selected from an acrylate, a methacrylate, an acrylamide, a methacrylamide and a maleimide.

19. A printing plate precursor according to claim 18, wherein the coating comprises a second layer including a phenolic resin, said second layer being located above the first layer comprising the binder including a monomeric unit including a salicylic acid group and a monomeric unit including a sulfonamide group.

20. A printing plate precursor according to claim 18, wherein the monomeric unit including a sulfonamide group is represented by $-NR^j-SO_2-$, $-SO_2-NR^k-$ wherein $R^j$ and $R^k$ each independently represent hydrogen, an optionally substituted alkyl, alkanoyl, alkenyl, alkynyl, alkaryl, cycloalkyl, heterocyclic, aryl, heteroaryl, aralkyl or heteroaralkyl group, or combinations thereof.

* * * * *